United States Patent [19]
Bulucea et al.

[11] Patent Number: 5,701,023
[45] Date of Patent: Dec. 23, 1997

[54] INSULATED GATE SEMICONDUCTOR DEVICE TYPICALLY HAVING SUBSURFACE-PEAKED PORTION OF BODY REGION FOR IMPROVED RUGGEDNESS

[75] Inventors: Constantin Bulucea, Milpitas; Richard A. Blanchard, Los Altos, both of Calif.

[73] Assignee: National Semiconductor Corporation, Santa Clara, Calif.

[21] Appl. No.: 285,581

[22] Filed: Aug. 3, 1994

[51] Int. Cl.$^6$ .............................. H01L 29/74; H01L 29/76
[52] U.S. Cl. ..................... 257/341; 257/139; 257/142; 257/335; 257/339; 257/342
[58] Field of Search ............................. 257/339, 341, 257/342, 335, 139, 142

[56] References Cited

U.S. PATENT DOCUMENTS

| | | |
|---|---|---|
| Re. 33,209 | 5/1990 | Plummer . |
| 4,055,884 | 11/1977 | Jambotkar . |
| 4,072,975 | 2/1978 | Ishitani . |
| 4,101,922 | 7/1978 | Tihanyi et al. . |
| 4,148,046 | 4/1979 | Hendrickson et al. . |
| 4,148,047 | 4/1979 | Hendrickson . |
| 4,199,774 | 4/1980 | Plummer . |
| 4,345,265 | 8/1982 | Blanchard . |
| 4,376,286 | 3/1983 | Lidow et al. . |
| 4,399,449 | 8/1983 | Herman et al. . |
| 4,532,534 | 7/1985 | Ford et al. . |
| 4,561,003 | 12/1985 | Tihanyi et al. . |
| 4,587,713 | 5/1986 | Goodman et al. . |
| 4,593,302 | 6/1986 | Lidow et al. . |
| 4,642,666 | 2/1987 | Lidow et al. . |
| 4,680,604 | 7/1987 | Nakagawa et al. ............ 257/142 |
| 4,680,853 | 7/1987 | Lidow et al. . |
| 4,686,551 | 8/1987 | Mihara ............................ 257/339 |
| 4,705,759 | 11/1987 | Lidow et al. . |
| 4,789,882 | 12/1988 | Lidow . |
| 4,803,532 | 2/1989 | Mihara . |

(List continued on next page.)

FOREIGN PATENT DOCUMENTS

| | | |
|---|---|---|
| 0 091 686 | 10/1983 | European Pat. Off. . |
| 0 110 331 | 6/1984 | European Pat. Off. . |

(List continued on next page.)

OTHER PUBLICATIONS

S.C. Sun and J.D. Plummer, "Modeling of the On-Resistance of LDMOS, VDMOS, and VMOS Power Transistors", *IEEE Transactions on Electron Devices*, vol. ED-27, pp. 356-367 (1980).

S.M. Sze, "VLSI Technology", Second Edition, McGraw-Hill, New York (1983), title and publication pages, pp. 219-233, 258-260.

(List continued on next page.)

*Primary Examiner*—Jerome Jackson
*Assistant Examiner*—Valencia Martin Wallace
*Attorney, Agent, or Firm*—Skjerven, Morrill, MacPherson, Franklin & Friel LLP; Ronald J. Meetin

[57] ABSTRACT

An insulated gate semiconductor device contains a common drain and a plurality of cells, each having a body region and a source. In each cell, the body region contains a channel region extending between the common drain and the source. The body region further includes a special portion spaced apart from the channel region, more heavily doped than the portion of the body region below the source, extending no more than an electrically insignificant amount below the source, and not extending significantly deeper below the upper semiconductor surface than the portion of the body region underlying the source. The special portion of each body region provides improved ruggedness under drain avalanche conditions. The special portion of each body region normally reaches a peak net dopant concentration below the upper semiconductor surface. Instead of, or in addition to, having the special portion of each body region be subsurface-peaked, the portion of each body region below the source can extend deeper below the upper semiconductor surface than the portion of the body region underlying the special portion.

52 Claims, 13 Drawing Sheets

U.S. PATENT DOCUMENTS

| | | |
|---|---|---|
| 4,837,606 | 6/1989 | Goodman et al. . |
| 4,959,699 | 9/1990 | Lidow et al. . |
| 4,974,059 | 11/1990 | Kinzer et al. . |
| 5,008,725 | 4/1991 | Lidow et al. . |
| 5,023,191 | 6/1991 | Sakurai ................................. 257/341 |
| 5,043,779 | 8/1991 | Nishimura . |
| 5,070,377 | 12/1991 | Harada ................................. 257/339 |
| 5,072,266 | 12/1991 | Bulucea et al. . |
| 5,130,767 | 7/1992 | Lidow et al. . |
| 5,191,396 | 3/1993 | Lidow et al. . |
| 5,304,831 | 4/1994 | Yilmaz et al. ........................ 257/341 |
| 5,323,041 | 6/1994 | Matsushita et al. .................. 257/339 |
| 5,477,077 | 12/1995 | Kumagai et al. ..................... 257/342 |

FOREIGN PATENT DOCUMENTS

| | | |
|---|---|---|
| 0 292 782 | 11/1988 | European Pat. Off. . |
| 4022021 | 1/1991 | Germany . |
| 51-85381 | 7/1976 | Japan . |
| 55-121682 | 9/1980 | Japan . |
| 57-42164 | 3/1982 | Japan . |
| 60-74665 | 4/1985 | Japan ................................. 257/341 |
| 61-156882 | 7/1986 | Japan . |
| 62-214667 | 9/1987 | Japan ................................. 257/339 |
| 62-217664 | 9/1987 | Japan ................................. 257/342 |
| 4011740 | 1/1992 | Japan . |
| 4061279 | 2/1992 | Japan . |
| 4-151875 | 5/1992 | Japan ................................. 257/335 |
| 6005868 | 1/1994 | Japan . |
| 6163909 | 6/1994 | Japan . |
| 2062349 | 5/1981 | United Kingdom . |

OTHER PUBLICATIONS

I. J. Tihanyi, "A Qualitative Study of the DC Performance of SIPMOS Transistors", Siemens Forsch—u. Entwickl.–Ber. Bd. 9 (1980) Nr. 4.

K.P. Lisiak et al., "Optimization of Non–Planar Power MOS Transistors", IEEE Transactions on Electron Devices, vol. ED–25, No. 10, pp. 1229–1234 (1978).

A. Lidow et al., "Power MOSFET Technology", IEEE pp. 79–83 (1979).

Heng et al., "Vertical M.O.S. Transistor Geometry For Power Amplification at Gigehertz Frequencies", Electronics Letters, vol. 10, No. 23 pp. 490–492 (1974).

J.W. Mayer et al., "Ion Implantation in Semiconductors, Silicon and Germanium", Ch. 1, 2, 4, Academic Press, New York (1970).

I. Yoshida et al., "A High Power MOSFET With a Vertical Drain Electrode and a Meshed Gate Structure", IEEE Journal of Solid–State Circuits, vol. SC–11, No. 4, pp. 472–477 (1976).

Distance into silicon along line 2-2'

Distance into silicon along line 4-4'

Distance into silicon along line 19-19'

INSULATED GATE SEMICONDUCTOR DEVICE TYPICALLY HAVING SUBSURFACE-PEAKED PORTION OF BODY REGION FOR IMPROVED RUGGEDNESS

BACKGROUND OF THE INVENTION

1. Field of the Invention

The present invention relates generally to insulated gate field effect semiconductor devices and more specifically to insulated gate field effect transistors (IGFETs), silicon controlled rectifiers (SCRs), insulated gate bipolar transistors (IGBTs) and the like. More particularly, the invention relates to vertical planar and non-planar devices of the double-diffused MOS (DMOS) variety, and still more particularly to the class of such devices adapted for use in applications requiring high power handling capabilities.

2. Description of the Background Art

Vertical insulated gate field effect semiconductor devices such as IGFETs, IGBTs and SCRs are commonly used to perform high power switching functions in power supply, automotive and other applications. Insulated gate field effect devices are generally characterized by very high input impedance, low turn-on or threshold voltages, and resistance to thermal effects, which are desirable in such applications, and which generally distinguish them from bipolar devices.

In designing such devices for high power switching applications, it is desirable to maximize the current carrying capacity in the forward conductance ("on") mode while simultaneously maximizing the breakdown voltage level in the blocking ("off") mode.

To achieve the first objective, it is important to maximize the number of discrete current-conducting cells comprising the device. At the same time, it is desirable to shrink the cell dimensions as much as possible in order to reduce the size of the silicon chip in which they are formed and hence reduce the cost per device. Today's IGFETs, for example, commonly contain as many as 100,000–250,000 discrete current-conducting transistor cells operating in parallel to carry currents as high as 50–100 amperes in dice ranging from about 50–300 square mils in size.

The second objective is generally achieved by suitable selection of the resistivity and thickness dimension of the drift or drain region, which in vertical devices is typically epitaxially grown on a low resistivity substrate. In addition, it is desirable to design cell structures which distribute or shape the concentration of the electric field in the blocking mode so that under drain avalanche conditions problems such as activation of parasitic devices and damage to dielectric layers are avoided.

Drain avalanche breakdown typically occurs under conditions of high reverse drain-source voltage. Under such conditions, impact ionization generates avalanche current carriers, i.e., holes or electrons, in the device. The avalanche current flow is concentrated in areas of high electrical field intensity. Although the drain avalanche condition may occur under the application of steady state drain-source voltages, it most commonly occurs as a result of very high transient voltages, for example in switching applications involving unclamped inductive loads.

IGFETs in particular are generally subject to two major failure mechanisms under avalanche breakdown conditions. The first failure mechanism is a result of avalanche initialization around the peripheral areas of the device, which ultimately leads to localized thermal failure around the periphery or termination regions. This mechanism has been addressed by special structural designs which redistribute the electric field and determine the avalanche initialization away from the periphery and into the active cell region of the device. For example, it has been common to employ one or more field rings or field plates in the vicinity of the periphery.

The second major failure mechanism results from avalanche current generation in the active cell region and its effect on the parasitic bipolar transistor which is inherent in IGFETs, and particularly in metal oxide silicon FETs (MOSFETs). All MOSFETs have a parasitic bipolar transistor which comprises the adjacent source, body, and drain regions of the MOSFET. Under drain avalanche conditions, impact-ionization generated carriers may be injected laterally into the base region of the parasitic bipolar, i.e., the body region of the MOSFET beneath the source. This portion of the body region is typically relatively lightly doped and thus has relatively high resistivity. The lateral flow of avalanche current through the region thus produces a voltage drop across the parasitic bipolar base-emitter junction. When the base current reaches a point where the base-emitter voltage drop exceeds the turn-on voltage of the junction (about 0.7 volts in silicon), the parasitic bipolar turns "on" and begins to conduct current between its collector (the MOSFET drain) and its emitter (the MOSFET source). If not prevented or limited, this leads to a "latch-up" condition in which current flows directly between the MOSFET source and drain. Operationally this is an undesirable result because gate control of the MOSFET is lost.

In addition to maximizing the breakdown voltage of the device, it is also highly desirable to maximize the "ruggedness" of the device, i.e., its ability to withstand avalanche breakdown conditions without being damaged or destroyed. Heretofore, semiconductor device designers have attempted to achieve this feature by designing cell structures to redistribute the electric field and redirect the avalanche current flow within the active cell region, and to resist activation of the parasitic bipolar transistor, while maintaining relatively small cell dimensions. The attempts of which applicants are aware have been less than completely successful in providing devices which are rugged and which simultaneously retain the other desirable electrical characteristics of this class of devices.

For example, vertical DMOS FET cell designs have been proposed in which the body in the central region of the cell, away from the gate-channel region, is characterized by a deep, heavily-doped portion, whereas the region of the body underlying and adjacent to the source, channel and gate is more lightly doped. The so-called "deep-body" cell design, which is disclosed in U.S. Pat. Nos. 4,642,666 and 4,705,759 to Lidow et al., is intended to redirect avalanche breakdown current to the deep body portion and away from the source, gate and channel regions.

The "deep-body" cell design has certain short-comings. The deep-body dopant is introduced relatively early in the fabrication process and it is difficult to control the lateral diffusion of the heavily doped central body region during subsequent fabrication steps. Lateral diffusion of the deep-body dopant into the channel region can easily occur, resulting in an attendant and undesirable increase in the turn-on threshold of the device. This consequence can be avoided if the lateral dimensions of the cell are maintained relatively large. However, this in turn reduces the number of cells which can be fabricated on a die of a given size and therefore reduces the forward current carrying capacity of the device for a given die size. Moreover, the "deep-body" cell design generally requires a relatively thick drain to accommodate the relatively deep vertical diffusion of the deep-body dopant. Thus, the "deep-body" design is essentially limited to use in relatively large devices rated for very high breakdown voltages.

It has also been proposed to use a highly-doped "shallow-body" in the central cell region of the body. The so-called "shallow-body" cell design is disclosed in U.S. Pat. No. 4,974,059 issued to Kinzer et al. In this design, the highly-doped shallow-body region extends from the central cell region and beneath the source region. It is intended to inhibit turn-on of the parasitic bipolar transistor by increasing the doping concentration of the base region and thus reducing its resistivity. This in turn requires the base current to be higher to forward bias the base-emitter junction and turn-on the parasitic bipolar. While the shallow-body cell design improves upon the deep-body design in certain respect, it too has certain short-comings. Because the shallow-body is shallow, its periphery exhibits a relatively sharp curvature beneath the source. This relatively sharp curvature tends to intensify the electric field in that region. Thus, under avalanche breakdown conditions, avalanche current will tend to flow heavily in that region because the electric field is most intense there. Simulations have shown that the shallow-body design is not effective in preventing avalanche current flow into the base of the parasitic bipolar, but only requires a greater current flow to turn-on the parasitic bipolar. Therefore, when the parasitic bipolar does turn on, it turns on at a higher avalanche current. The so-called "shallow-body" design has thus been shown to improve device ruggedness, but not to completely eliminate turn-on of the parasitic bipolar.

It is therefore an object of the present invention to overcome these and other short-comings of prior art cell designs by means of a cell design strategy for insulated gate semiconductor devices which employs strategically placed, highly-doped implant regions, which significantly improve device ruggedness.

It is a further object of the invention to improve upon the prior art cell designs by strategically locating and tailoring highly-doped implant regions to effectively reshape the electric field structure and to redirect avalanche breakdown current flow toward the central cell region and away from the insulated gate, channel and source regions.

It is still a further object of the invention to employ strategically placed and tailored highly-doped implant regions to redirect avalanche current flow away from the base of the parasitic bipolar transistor inherent in MOSFETs and to thereby prevent activation of the parasitic bipolar under an avalanche breakdown condition.

It is another object of the invention to provide the foregoing improvements in a way that is consistent with shrinkage of cell dimensions in order to allow packing more cells per unit area of semiconductor die and to thus improve the current per area carrying capacities of insulated gate semiconductor devices employing the invention.

It is still a further object of the invention to provide the foregoing improvements with little or no impact on critical electrical characteristics of existing devices, such as breakdown voltage and turn-on threshold, and with minimal impact on conventional fabrication processes.

SUMMARY OF THE INVENTION

The foregoing and other objects and advantages of the present invention are achieved in an insulated gate field effect semiconductor device having a plurality of cells formed in and on a semiconductor chip by the strategic placement of highly-doped implants in the central regions of the cells. The device has a drain region which is relatively lightly doped with a species of a first conductivity type and which extends from the upper surface of the chip. A plurality of body regions doped with impurities of a second conductivity type extend a certain depth into the drain region. A corresponding source region of the first conductivity type extends into each of the body regions, extending substantially around and being laterally spaced from the periphery thereof. For each body region, the portion of the body region interior of the corresponding source region defines a central cell region, and the portion of the body region between the source region and the periphery of the body region defines a channel region. At least one insulated gate structure is adjacent to each of the channel regions. At least a portion of each central cell region has a substantially higher concentration of species of the second conductivity type than the remainder of the corresponding body region so that when the device is operated in blocking mode at high drain voltages, the electric field is concentrated and avalanche current flows substantially within the central cell region and away from the source, gate and channel regions, thus preventing activation of the parasitic bipolar transistor and improving device ruggedness under drain avalanche breakdown conditions.

The peak concentration of the species of the second conductivity type in the portion of the central cell region having a substantially higher concentration is preferably at least twice as great as the peak concentration of the species of the second conductivity type in the remainder of the body region.

DESCRIPTION OF THE PREFERRED EMBODIMENTS

Figure 1:
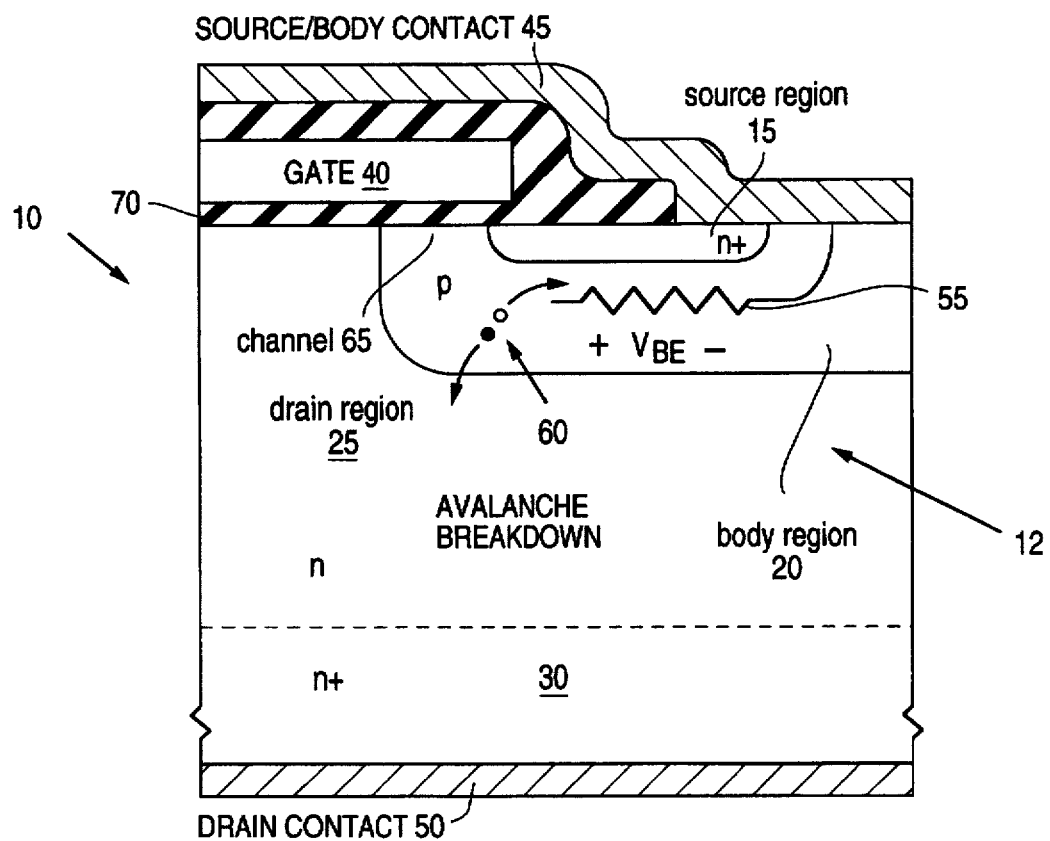
FIG. 1 is a cross sectional view illustrating in part a generic, planar, vertical DMOS FET cell and the parasitic bipolar transistor inherent in such cells.

Referring to the drawings, FIG. 1 illustrates approximately one-half of a cell 12 of a typical multi-cell vertical, planar, n-channel, enhancement-mode DMOS FET. Vertical, planar DMOS FETs are but one type of insulated gate semiconductor device to which the present invention is applicable. Others may include, for example, lateral and vertical IGFETs, non-planar IGFETs, IGBTs, SCR's, and others. Typically, today's vertical, planar, power DMOS FETs will have hundreds of thousands of identical transistor cells which operate in parallel. Different cell geometries have been adopted and are commonly in use, including hexagons, squares, triangles, rings, and others. The present invention is applicable to all such geometries.

Only about one-half of one active transistor cell is shown in FIG. 1 (and in subsequent figures also). Persons skilled in the art will recognize that the portion of the active cell shown in each of the figures comprises one side of a typical cell and that the other side will typically be identical in cross section.

As is well known, cells 12 are typically formed in a thin semiconductor wafer 10 of monocrystalline silicon, which is subsequently diced into individual multi-cell devices. The wafer 10 is typically heavily doped with species of a first conductivity type, in this case n-type, to form a low resistivity substrate 30. Phosphorus and arsenic are often-used n-type dopants for example. The substrate 30 is often 200 to 650 microns thick. A relatively thin drain region 25 is then formed on top of the substrate 30, typically by a well known epitaxial growth process. The drain is typically relatively lightly and uniformly doped with species of the same conductivity type as the substrate 30. However, as persons skilled in the art are aware, in so-called four layer devices such as SCRs and IGBTs the substrate 30 may be replaced or supplemented with a layer (not shown) of opposite conductivity type. The particular resistivity and thickness of the epitaxial drain region 25 depends on the desired breakdown voltage of the device. For example, a typical epitaxial drain region for a device rated in the 100 volt range will have resistivity in the range of about 1.0 to 2.5 ohm-centimeters and thickness between about 5 and 14 microns. A device rated at 500 volts will typically have drain resistivity in the range 8 to 40 ohm-centimeters and thickness in the range 15 to 40 microns.

A body region 20 doped with species of a second conductivity type, in this case p-type, is formed in the drain region 25 and forms a metallurgical junction therewith. Boron is a commonly used p-type dopant species. In the well known double diffused MOS, or so-called DMOS process, the body dopant is typically shallowly implanted into the drain region 25 through a window in a mask (not shown) on the upper surface of the wafer using well known ion implantation techniques. The dopant is then caused to diffuse into, i.e., is driven into, the drain region 25 by application of heat of a certain temperature for a certain time. Those skilled in the art are very knowledgeable regarding the details of this basic process, which need not be explained further herein. As mentioned previously, various geometries have been used for the body region 20.

The junction depth of the body region depends upon a number of design factors. However, it is not unusual in modern power DMOS FETs to observe body junctions ranging from about 1.5 to about 8 microns in depth. The body region 20 is critically doped in a moderate range of concentrations in order to provide a turn-on threshold for the device between about 1 and 2 volts. Peak surface dopant concentrations in the range $5 \times 10^{14}$ to $3 \times 10^{17}$ atoms per cubic centimeter are not unusual.

A source region 15 heavily doped with species of the first conductivity type is formed in the body region 20. The source region 15 is generally annular in shape and usually extends substantially around the periphery of the body region. Although generally annular in shape, the source region may in fact be circular, hexagonal, square, or some other shape, which may or may not be the same general shape as the body region 20. The source region is laterally spaced from the periphery of the body region to form a channel region 65. In the well known DMOS process, the source dopant is introduced into the body region 25 using known ion implantation or diffusion and drive processes, and is blocked from entering the channel region by the same mask edge used to introduce the body dopant. The length of the channel region 65, which is critical to the device's maximum drain voltage, on-resistance, and other electrical parameters, is thus defined by the difference in lateral diffusion of the body 20 and source 15. The relative lateral diffusion of these two regions, and thus the channel length, can be controlled with great precision by the application of well known body and source drive temperatures and times.

An insulated gate structure is formed on the top surface of the wafer 10 and is patterned to overlie the channel regions 65. The insulated gate structure may be formed either before or after introduction and diffusion of the body 20 and source 15 regions. In the former instance, the insulated gate structure itself may be used as part of the source and body mask. This is the well-known self-aligned gate process. The insulated gate structure typically includes a thin, electrically-insulating gate oxide layer 70, and an electrically conductive gate electrode 40. The thin gate oxide layer is typically grown on the top surface of the wafer 10 using well known oxide growth techniques. For example, the gate oxide may be grown by application of heat in an oxygen rich atmosphere during the drive of the source and body regions or afterwards. Typically, highly doped polysilicon, or an aluminum or molybdenum alloy is used for the gate electrode 40. The gate electrode 40 is typically formed and patterned to lie adjacent the channel regions 65 by depositing the electrode material on the wafer surface, applying a patterned mask, and selectively etching the unprotected regions of the material. Chemical vapor deposition, organic and hard mask application and patterning, and plasma and chemical etching processes for constructing and patterning the insulated gate structure are well known to persons skilled in the art and are not described further herein. The insulated gate structure is then typically covered with an insulating passivation layer.

A source/body contact 45 is also formed on the top surface of the wafer 10. The source/body contact is typically aluminum or another electrically conductive material. It is generally constructed and patterned using known metal deposition, masking, and etching techniques. The source/body contact 45 overlies and is in electrical contact with at least a portion of the source 15 and body 20 regions, thereby electrically shorting the two regions.

Finally, a drain contact 50 is formed. In vertical IGFETs, such as the generic MOSFET illustrated in FIG. 1, and in other vertical, insulated-gate semiconductors such as SCRs and IGBTs, the drain contact is typically formed by metalizing the lower surface of the wafer 10 in electrical contact with the substrate 30. However, in lateral IGFETs and other lateral devices, the drain contact may be constructed and pattered on the top surface of the wafer 10 using processes similar to those identified above with respect to the insulated gate structure and the source/body contact. The drain contact is typically a highly electrically conductive material. Gold or aluminum are often used for example.

The generic, vertical, planar MOSFET shown in FIG. 1 is an n-channel device. However, persons skilled in the art will appreciate that by simply switching the doping types of the various regions, an equivalent p-channel device may be constructed. Similarly, although the device of FIG. 1 is constructed as an enhancement mode device, persons skilled in the art will recognize that by a simple doping change in the channel region, an equivalent depletion mode device may be constructed. As will become apparent to persons skilled in the art from the description below, the current invention is applicable to and effective with all such device variations.

Still referring to FIG. 1, when a positive voltage bias exceeding the device's turn-on or threshold voltage is applied between the gate electrode 40 and the source-body contact 45, and a positive voltage exists between the drain and source electrodes, surface inversion of the channel 65 from p to n-type occurs and current flows through the device. The carrier flow is from the source/body contact, through the source region 15, the channel 65, vertically down through the epitaxial drain region 25, and the substrate 30, to the drain contact 50. This is the forward conduction or "on" mode of operation.

When the positive gate bias voltage is removed, the MOSFET is in the blocking mode of operation. In the blocking mode of operation, particularly in high power switching applications, the MOSFET is expected to withstand the application of high drain-source voltage differentials without breaking down. Moreover, should the MOSFET conduct current by avalanche breakdown in response to application of a drain-source voltage exceeding its breakdown voltage rating, it is highly desirable that it be sufficiently rugged to survive without being physically damaged or destroyed.

In high power switching applications involving unclamped inductive loads, it is particularly common for very high transient voltages to appear on the drain in the blocking mode. These voltages can easily trigger a drain avalanche breakdown condition in generic MOSFET cells such as the one illustrated in FIG. 1. In the drain avalanche breakdown condition, regions of intense electric field concentration within the device resulting from the high transient drain voltage produce localized ionization, which in turn generates avalanche current carriers 60, i.e., holes and electrons, and results in avalanche current flow within the device, which is potentially destructive.

A physical characteristic inherent in the generic vertical MOSFET cell, which exacerbates the avalanche breakdown condition, which contributes to accelerated breakdown, and which generally increases the risk of destruction of the device, is the parasitic bipolar transistor referred to previously. The parasitic bipolar comprises the adjacent source 15, body 20, and drain 25 regions of the vertical MOSFET cell. In the particular n-channel MOSFET illustrated in FIG. 1, the parasitic bipolar transistor is an NPN type. The body region 20 of the MOSFET corresponds to the base of the parasitic bipolar transistor.

Under drain avalanche conditions, avalanche current flows laterally into the base region of the parasitic bipolar beneath the source 15 under the force of the local electric field there. The base region being only moderately doped, a substantial resistance 55 exists between the parasitic bipolar's base and emitter (the source of the MOSFET cell). Thus, a certain avalanche current flow will be capable of forward biasing the parasitic bipolar's base-emitter junction and thus turning the bipolar on. This then results in greatly increased current flow directly between the source and drain regions and accelerated breakdown of the device.

Moreover, and more importantly, activation of the parasitic bipolar allows a high level of drain current, initiated by avalanche breakdown, to be supported by a reduced, sub-avalanche value of drain-to-source voltage. This is because the parasitic transistor action takes control over the avalanche ionization. This results in a negative resistance or "snap back" condition in the device's current-voltage characteristic, which is essentially destructive. In addition, activation of the parasitic bipolar may enhance the destructive capability of the avalanche breakdown condition in some cell designs by allowing high levels of avalanche breakdown current to flow in the vicinity of the source, channel and gate regions of the cell. In some cell designs, this may lead to breakdown and destruction of the very thin gate oxide (or other dielectric) layer 70 commonly used in many of today's devices, due to high thermal energies which accompany high levels of avalanche current flow.

It is thus highly desirable to prevent activation of the parasitic bipolar both to maximize the obtainable drain-source breakdown voltage and, in the event of drain avalanche breakdown, to concentrate the electric field intensity and avalanche current flow within the central cell region and away from the vicinity of the gate, source, and channel regions of the cell.

It has previously been proposed to inhibit activation of the parasitic bipolar and to redirect the flow of avalanche current by introducing additional dopant into a central portion of the body region 20 and into a portion of a body region 20 beneath source region 15 of the MOSFET, i.e., into the base of the parasitic bipolar. The theory behind this approach is to reduce the base resistance and decrease the injection efficiency of the parasitic bipolar, and to thus inhibit its activation, at least at relatively low and moderate avalanche current levels, while redirecting breakdown to the central region of the cell.

Figure 2:
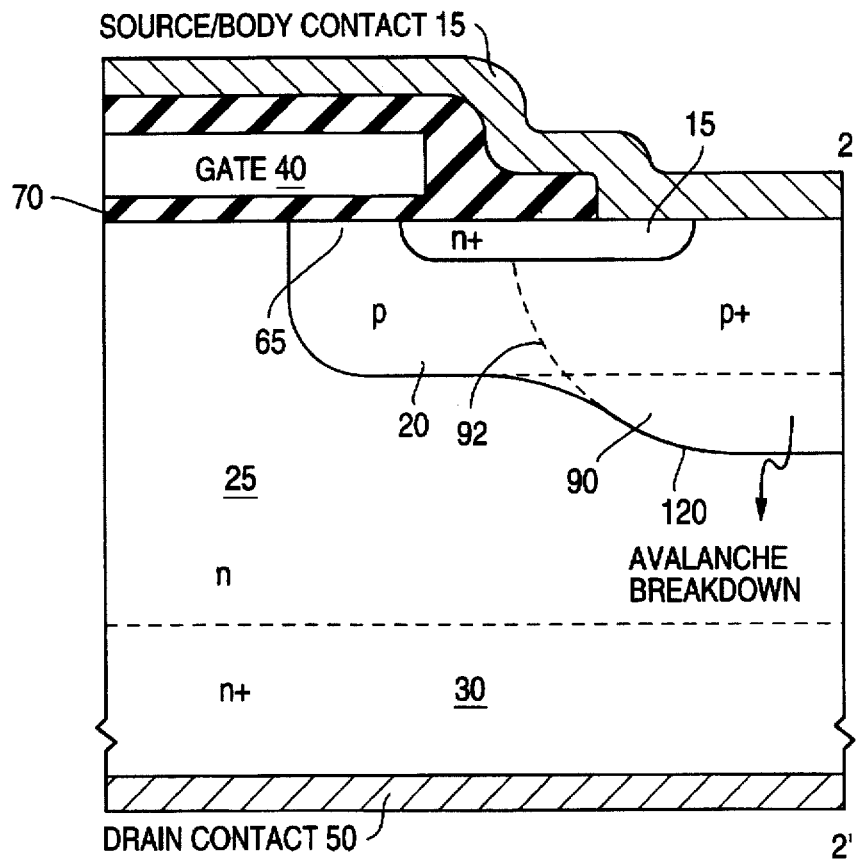
FIG. 2 is a cross sectional view illustrating a prior art, planar, vertical DMOS FET cell of the so-called "deep-body" type.
Figure 3:
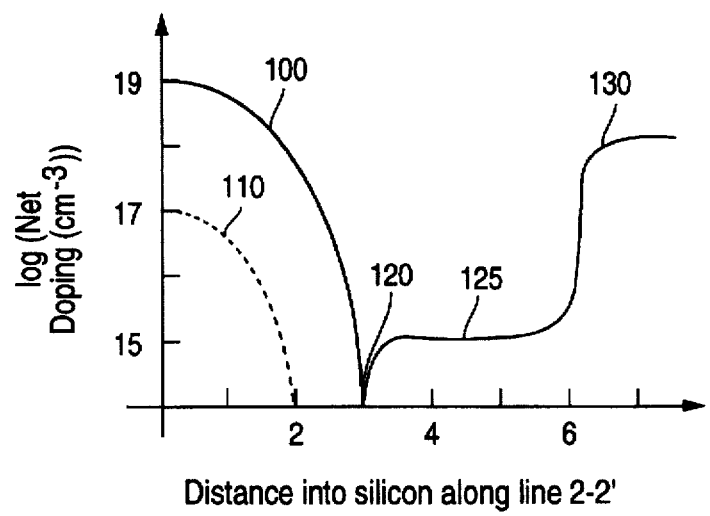
FIG. 3 is a graph illustrating an exemplary profile of doping concentration versus depth taken through the center of the cell of FIG. 2.
Figure 4:
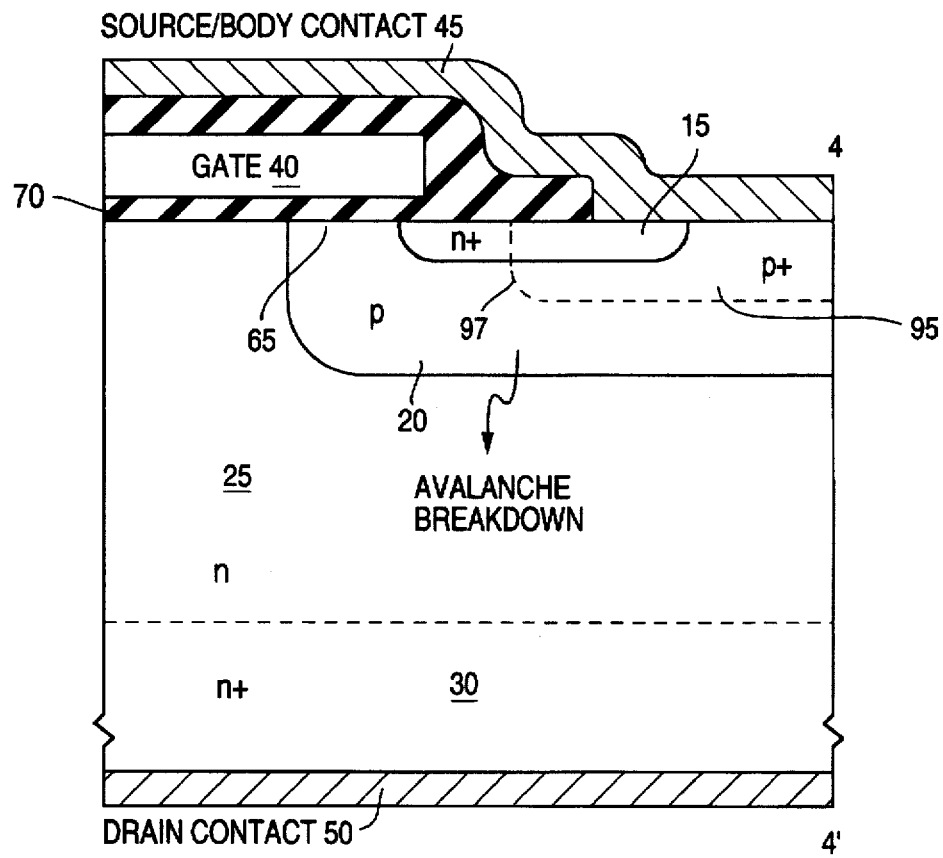
FIG. 4 is a cross sectional view illustrating in part a prior art, planar, vertical DMOS FET cell of the so-called "shallow-body" type.
Figure 5:
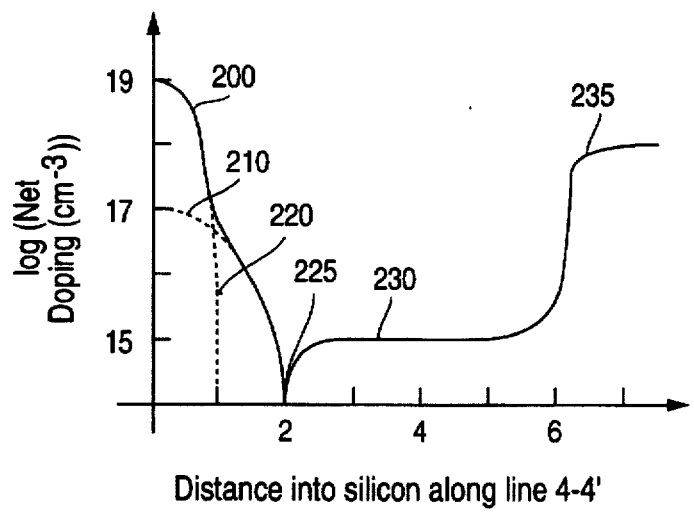
FIG. 5 is a graph illustrating an exemplary profile of doping concentration versus depth taken through the center of the cell of FIG. 4.

Referring to FIGS. 2–5, at least two distinct approaches have been suggested in the prior art. The approach shown in FIGS. 2 and 3 is the so-called "deep-body" approach. The approach illustrated in FIGS. 4–5 is the so-called "shallow-body" approach.

In the deep-body approach shown in FIG. 2, a very high concentration of the same type dopant used in the body 20 is introduced into the central cell region beneath the source/body contact, typically by common ion implantation or diffusion and drive techniques. Generally, the high concentration of dopant is introduced relatively early in the fabrication process and diffuses both vertically and laterally during subsequent processing to form a well-rounded, relatively deep-body structure 90 in the central cell region having low resistivity.

As shown in FIG. 3, the dopant concentration 100 of the deep body 90, which is p+ in this instance, overwhelms the body dopant concentration 110. For example, the peak doping concentration of the deep body 90 at the wafer surface may be in the range of $10^{19}$ atoms per cubic centimeter, whereas the peak doping concentration of the body is in the range of $10^{17}$ atoms per cubic centimeter. In addition, in order to be a point of concentration for avalanche breakdown, the heavily doped deep-body 90 typically extends 4–8 microns deep into the drain region 25, which as a result must be relatively thick.

The deep-body approach, while somewhat successful in inhibiting activation of the parasitic bipolar and redirecting breakdown, introduces additional problems. For one, the high concentration of deep-body dopant is introduced relatively early in the fabrication process and diffuses a substantial distance both laterally and vertically during subsequent processing. As a result, the deep body dopant often diffuses not only beneath the source, but also into the channel region 65 as well. This has the undesirable effect of increasing the turn-on or threshold voltage of the device. Such a change to the electrical characteristics of the device is in most cases unacceptable. For similar reasons, the deep-body approach is not easily accommodated in cells having very small dimensions, and this effectively limits the deep-body approach to rather large devices having high breakdown ratings. Smaller devices using the deep-body approach generally will have relatively low current handling capacities.

The so-called "shallow-body" approach illustrated in FIGS. 4 and 5 at least partially addresses the problems and short-comings of the deep-body approach. In the shallow-body approach, a high concentration dose of dopant of the same conductivity type as the body 20, which is p-type in this instance, is introduced into the center of the cell beneath the source/body contact 45 and is extended at least partially under the source 15. As with the deep-body approach, the peak concentration of the shallow-body region 95 may be on the order of $1-2\times10^{19}$ atoms per cubic centimeter at the surface, as compared to a peak concentration in the range of $10^{17}$ atoms per cubic centimeter for the body region 20, thereby overwhelming the dopant concentration of the body. This is depicted graphically in FIG. 5 where line 200 corresponds to an exemplary doping concentration profile of the combined p+ shallow-body 95 and p-body 20 dopant of the cell of FIG. 4. The dotted line 210 designates an exemplary doping concentration profile of the p-body 20 alone and the dotted line 220 designates the doping concentration profile of the p+ shallow-body 95 alone.

Also as shown in FIG. 5, the p-body region 20 typically only extends into the drain region approximately 2μ or so before forming a metallurgical junction 225 with the n-type drain 25. Region 230 of FIG. 5 depicts the doping concentration profile of the relatively lightly doped, n-type epitaxial drain region of the cell of FIG. 4. In this example, the drain is relatively uniformly doped to a concentration on the order of $10^{15}$ atoms per cubic centimeter and is approximately 6μ or more thick, which corresponds to an expected device breakdown voltage on the order of 100 volts. The doping concentration profile of the highly doped n+ substrate 30 is designated by 235. Typically the substrate will have a relatively uniform doping concentration on the order of $5\times10^{18}$ to $1\times10^{20}$ atoms per cubic centimeter or more to provide a good ohmic contact with the drain contact 50.

As with the deep-body approach, in the shallow-body approach, the shallow-body region 95 is typically introduced by commonly known ion implant and drive techniques. However, in contrast to the deep-body approach, the dopant is typically introduced fairly late in the overall fabrication process. As a result, there is much less vertical and lateral diffusion of the dopant during the remainder of the process than in the deep-body approach. The shallow-body approach thus has the advantage of being usable in cells having relatively small dimensions with less risk of adversely affecting the device turn-on or threshold voltage. Moreover, since the shallow-body approach produces a shallower cell, a thinner epi (drain) can generally be used than in the deep-body approach.

Like the deep-body approach, however, the shallow-body approach has drawbacks. Under drain avalanche conditions, simulations have shown the shallow-body cell is not entirely effective either in preventing activation of the parasitic bipolar or in directing the avalanche breakdown current into the central cell region and away from the source, channel and gate regions. A basic reason for this is that the heavily-doped p+ shallow-body region 95 is not designed to prevent current flow laterally into the base of the parasitic bipolar. It is designed to allow current to flow through the base but to essentially reduce the base resistance so as to increase the current required to turn-on the bipolar. Another reason is that the shallow-body is characterized by a fairly sharp curvature 97 at its periphery beneath the source 15. This curvature has the effect of concentrating the electric field in the region and initiating ionization and avalanche current flow there.

Figure 6:
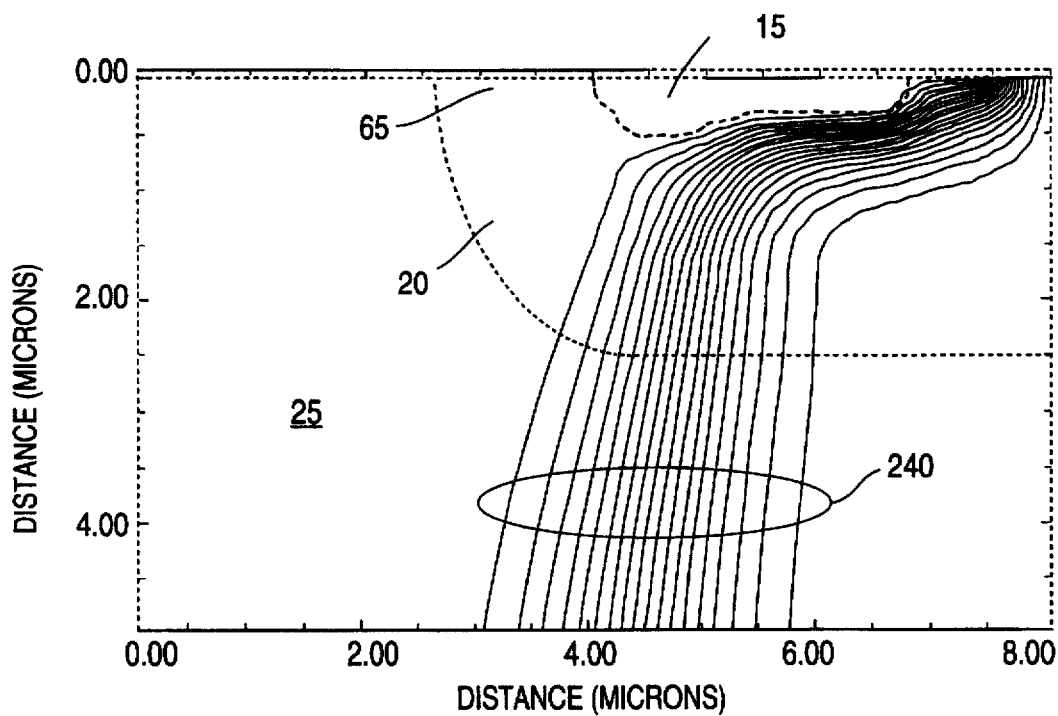
FIG. 6 is a cross sectional view illustrating avalanche current flow in the prior art cell of FIG. 4 under a drain avalanche condition.

Referring to FIG. 6, simulations of the shallow-body cell of FIG. 4 having a doping profile substantially as shown in FIG. 5 have been conducted using the MEDICI Two Dimensional Semiconductor Device Simulation Program available from Technology Modeling Associates, Inc. of Palo Alto, Calif. For convenience, the various regions of the cell shown in FIG. 6 are labelled with the same reference numbers as their corresponding regions shown in FIG. 4. Lines 240 depict the flow path of avalanche current in the cell in a condition of drain avalanche breakdown at a drain voltage of 124.8 volts. Each of the lines 240 corresponds to approximately 5% of the total avalanche current flow. The eighteen lines 240 thus depict essentially the entire avalanche current flow at the specified conditions. As can be seen, a substantial portion of avalanche current in fact flows laterally in the body region 20 immediately beneath and adjacent to the source region 15 and channel region 65. Moreover, the crowding and sharp bending of the current lines in the body region 20 immediately below and adjacent to the source 15 and channel 65 regions demonstrates that the electric field concentration in this region is very intense. As previously indicated, this is due at least in part to the fact that the relatively shallow p+ region 95 exhibits a relatively sharp curvature 97 at its periphery immediately beneath and adjacent to the source 15 and channel 65 regions. As persons skilled in the art are aware, the sharp curvature 97 of the heavily doped p+ region 95 has the effect of concentrating the electric field in that region. Hence, the shallow-body approach has in fact been found ineffective to direct avalanche breakdown current flow within the central cell region and away from the source, channel and gate regions.

Figure 7:
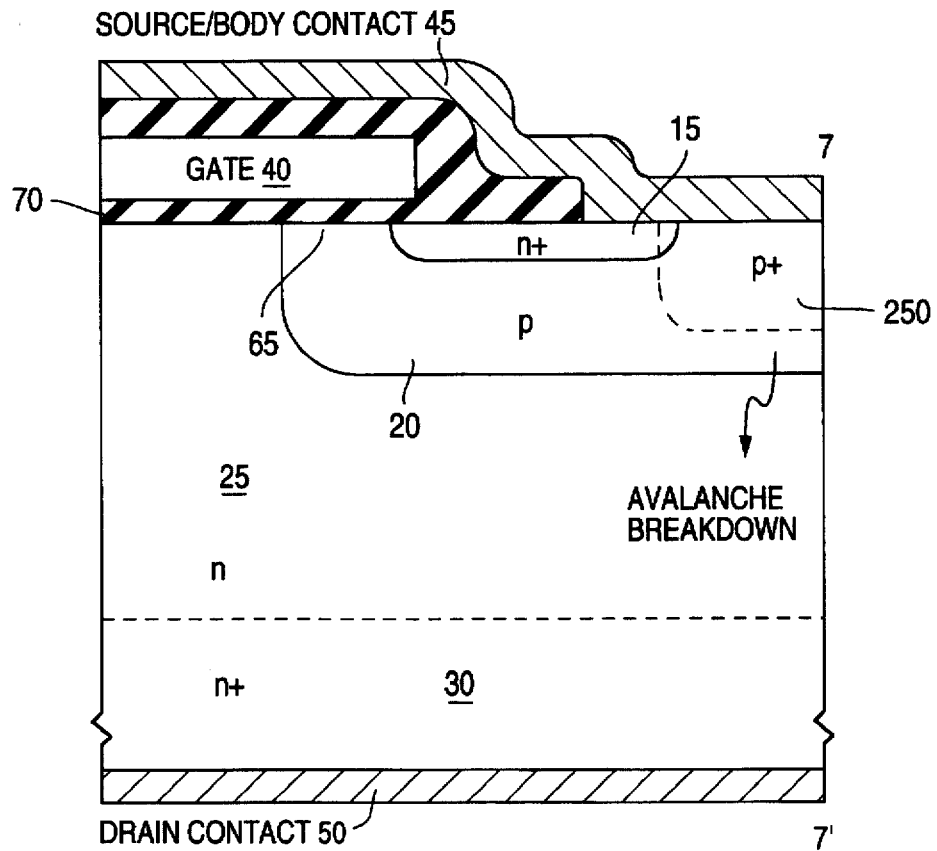
FIG. 7 is a cross sectional view illustrating in part a vertical, planar DMOS FET cell incorporating a first preferred embodiment of the present invention.

In contrast, FIG. 7 depicts in cross-section a vertical, planar, n-channel, enhancement mode MOSFET cell which incorporates a first preferred embodiment of the present invention. This cell is effective in preventing activation of the parasitic bipolar transistor, and in concentrating the flow of avalanche breakdown current in the central cell region, thereby improving ruggedness. The cell of FIG. 7 is similar structurally to the shallow-body cell of FIG. 4. For convenience, therefore, similar regions of the cells are identified with the same reference numbers. Like the cell of FIG. 4, the cell of FIG. 7 has a relatively shallow p-body region 20 and a highly doped p+ region 250 in the central cell region. The cell of FIG. 7 differs substantially from the shallow-body cell of FIG. 4 in at least three significant respects, however. First, the p+ region 250 is constrained not to encroach upon or underlie the source region 15 by more than a minor and insignificant amount, if at all. Second, the p+ region 250 preferably transitions into the remainder of the p-body 20 at a somewhat deeper point than the typical shallow-body region 95 which has previously been employed. Third, the p+ region 250 preferably has a substantially higher doping concentration than the shallow-body region 95 which has previously been employed. Preferably, the p+ region 250 has a doping concentration at least 2–4 times higher than the typical p+ shallow-body region 95 which has previously been employed.

The p+ region 250 has a peak net dopant concentration that occurs substantially along the upper surface of the semiconductor chip in which the n-channel MOSFET cell is formed. The peak net dopant concentration in the p+ region 250 is at least twice the peak net dopant concentration in the remainder of the p-body region 20. In particular, the peak net dopant concentration in the p+ region 250 is $10^{18}$–$10^{20}$ atoms per cubic centimeter for the exemplary case in which the peak net dopant concentration in the p-body region 20 is $10^{17}$–$10^{18}$ atoms per cubic centimeter.

The p+ region 250 normally extends into the p-body region 20 to a depth of 50–80 percent of the depth of body region 20. That is, the lowest point at which the p+ region 250 transitions into the p-body region 20 is 50–80 percent of the depth of the lowest point along the bottom surface of the p-body region 20. Specifically, the depth of the p+ region 250 is 1–3.5 microns for the exemplary case in which the depth of the p-body region 20 is 2–4 microns.

Advantageously, the cell of FIG. 7 may be fabricated using essentially the same process known and used to fabricate typical shallow-body cells having the p+ region 95 shown in FIG. 4. One such process is described in U.S. Pat No. 4,974,059 to Kinzer for example. The p+ region 250 may be introduced at the same place in the process sequence the shallow p+ body 95 would have been. Alternatively, it may be introduced earlier or later in the process so long as the constraints on lateral diffusion mentioned above are observed. The only substantial process difference is in the mask used to define the p+ region 250 and the implant dose and drive parameters employed.

Unlike the mask used for the p+ region 95 in the typical shallow-body cell of FIG. 4, the mask used to define the p+ region 250 in the cell of FIG. 7 preferably has a window which opens over the central cell region but that does not extend over the source region 15. Even more preferably, the edges of the window opening are sufficiently laterally displaced from the inner periphery of the source 15 so that subsequent processing steps result in substantially no diffusion of the p+ body dopant into the body region 20 beneath the source 15.

Figure 8:
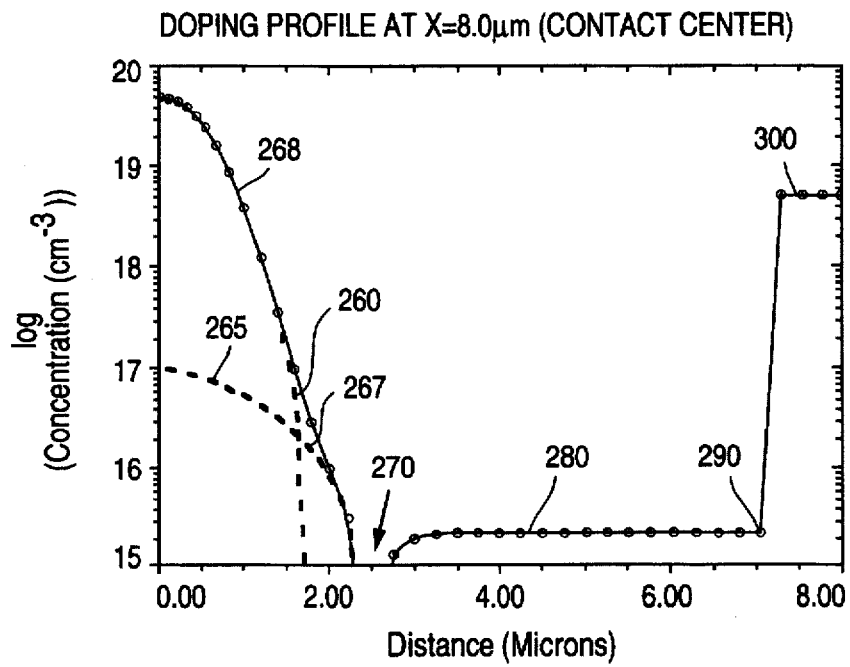
FIG. 8 is a graph illustrating an exemplary profile of doping concentration versus depth taken through the center of the cell of FIG. 7.

FIG. 8 illustrates a preferred doping concentration profile for the cell of FIG. 7 taken through the center of the cell, which corresponds substantially with line 7-7'. Preferably, an implant dose is used for the p+ region 250 which provides a peak surface doping concentration on the order of at least about $5 \times 10^{19}$ atoms per cubic centimeter. The p-body region 20 in contrast preferably exhibits a peak surface doping concentration on the order of $1$–$2 \times 10^{17}$ atoms per cubic centimeter. The preferred doping concentration profile of the p+ region 250 is depicted by line 260. The preferred doping concentration for the p-body 20 is depicted by line 265. Line 268 depicts the combined doping profile of the two regions.

Preferably, suitable drive parameters are selected so that the junction between the p-body region 20 and the drain region 25 will occur at a relatively shallow depth of about 2.5μ or less. Alternatively, deeper junctions may be used as long as they are consistent with the object of obtaining the desired breakdown voltage. Similarly, a transition point on the order of approximately 1.75μ or about 70% of the depth of the body-drain junction is preferred between the p+ region 250 and the p-body region 20. However, deeper or shallower transition points are acceptable so long as they are consistent with the objectives of maintaining the desired breakdown voltage and of effectively concentrating avalanche current flow in the central cell region. The junction between the p-body region 20 and the n-type drain region 25 is depicted by point 270. Point 267 identifies the transition point between the p+ region 250 and p-body 20. Line 280 depicts the concentration profile of the relatively uniform and lightly doped n-type epitaxial drain region 25, which is preferably doped to a concentration on the order of $2 \times 10^{15}$ atoms per cubic centimeter and which preferably has a thickness of approximately 7.25μ. This combination of epi doping concentration and thickness results in a device having breakdown voltage on the order of 125 volts. However, as is well known to persons skilled in the art, the epi doping concentration and thickness may be altered as desired to produce devices having higher or lower breakdown voltages. Point 290 depicts the transition point to the n+ substrate 30. Line 300 depicts the preferred doping concentration profile of the relatively uniformly and highly doped substrate 30, which is preferably doped to an n+ concentration in the range of about $5 \times 10^{18}$ to $1 \times 10^{20}$ atoms per cubic centimeter.

Persons of ordinary skill in the art can readily determine the implant doses required to achieve the preferred surface concentrations, and of the drive time and temperature parameters necessary to achieve the preferred junction depths and doping concentration profiles. Accordingly, and since numerous different parameter combinations are acceptable to achieve the desired results, further detail is omitted herein.

Figure 9:
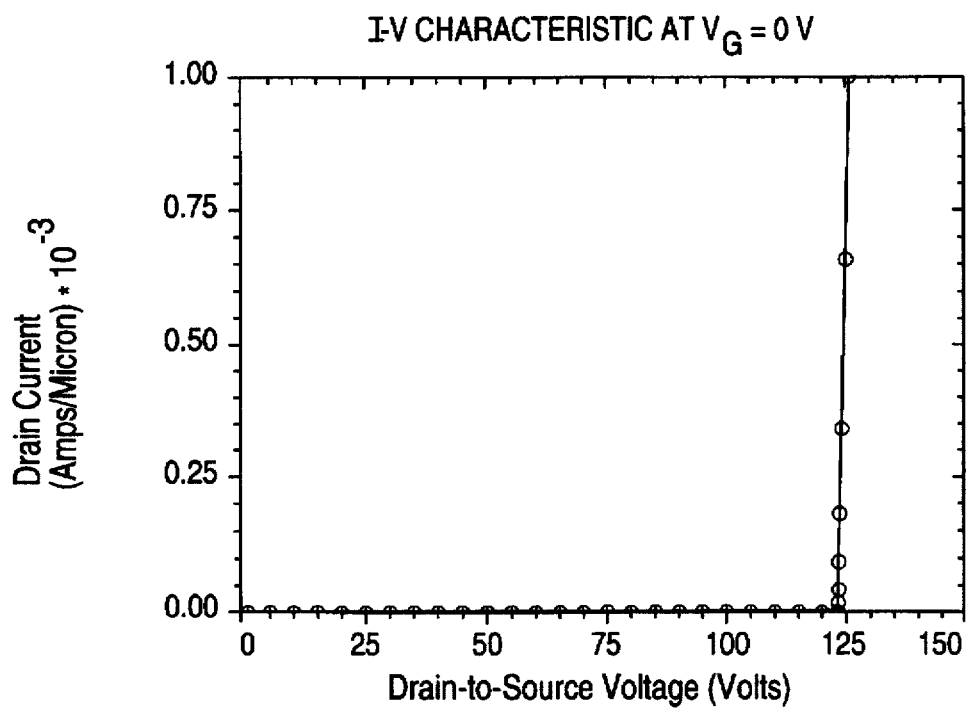
FIG. 9 is a graph illustrating an exemplary drain current versus voltage characteristic in reverse blocking mode for a vertical, planar DMOS FET embodying the cell design of FIG. 7.

FIG. 9 illustrates the blocking mode I-V characteristic at a gate voltage of 0 volts for the MOSFET cell of FIGS. 7 and 8. As can be seen, the breakdown voltage for this device is approximately 125 volts. Up until the 125 volt level is reached, essentially no current flows through the device. At a drain-source voltage of approximately 125 volts, ionization begins to occur in the cell and avalanche current begins to flow. Notably, the current then increases linearly with additional increase in voltage. However, even under avalanche breakdown conditions the I-V characteristic does not exhibit the "snap-back" phenomenon which is characteristic of activation of the parasitic bipolar, and which indicates bipolar breakdown.

Figure 10:
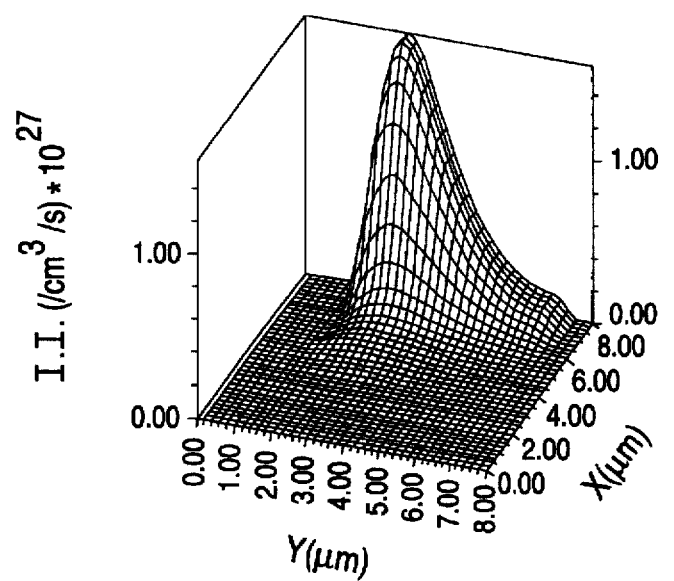
FIG. 10 is a three dimensional graph illustrating an exemplary ionization pattern within the cell of FIG. 7 under a drain avalanche condition.

FIG. 10 illustrates the location and degree of ionization that is generated within the cell of FIG. 7 at a drain avalanche current of 1 mA. As can be seen, the peak ionization occurs approximately between X coordinates 6–8μ and Y coordinates 2–3.5μ.

Figure 11:
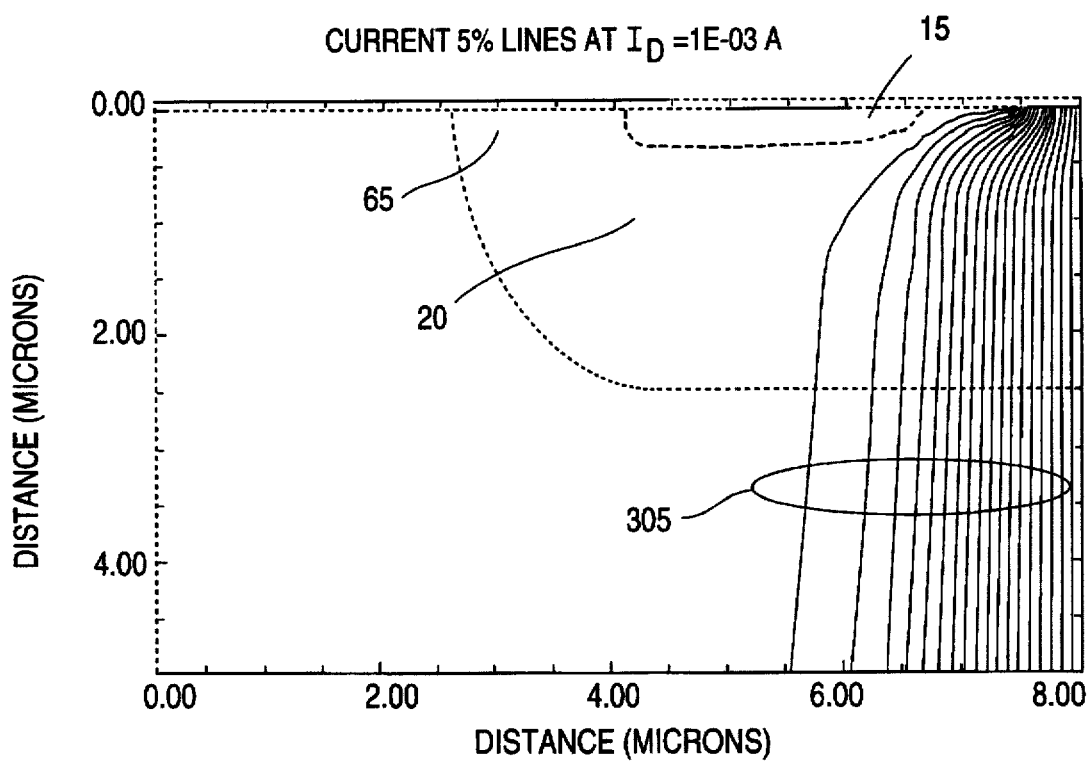
FIG. 11 is a cross sectional view illustrating avalanche current flow in the cell of FIG. 7 under a drain avalanche condition.

FIG. 11 depicts avalanche current flow in the cell of FIG. 7 at a magnitude of 1 mA. The horizontal axis of FIG. 11 corresponds to the X axis of FIG. 10 and the vertical axis corresponds to the Y axis of FIG. 10. It is apparent from FIGS. 10 and 11 that peak ion generation takes place in the central region of the cell beneath the source body contact and is substantially removed from the source, channel and gate regions of the device. The relatively high degree of crowding of the current lines 305 in the central region of the cell indicates that the intensity of the electric field is concentrated in the central cell region and away from the source, channel and gate regions. Moreover, the path of the current lines 305 demonstrates substantially all of the avalanche current flow is substantially redirected away from the portion of the p-body 20 beneath and adjacent to the source 15, and hence away from the base of the parasitic bipolar, and into the central cell region. The cell of FIGS. 7 and 8 is thus effective both to prevent activation of the parasitic bipolar by preventing current flow into its base region, and to improve the ruggedness of the device during conditions of avalanche breakdown by redirecting potentially destructive avalanche current flow away from the source and channel regions and into the central cell region.

The embodiment incorporated in the cell of FIGS. 7 and 8 is particularly advantageous for use in small cells and for high current and low to medium voltage applications. Restriction of the highly-doped p+ region 250 to the central cell area, with no more than minimal and negligible encroachment of the source region, restrains the dopant from potentially entering the channel region or deepening the body-drain junction due to emitter-push or other effects. Thus, significant shrinkage of the cell dimensions is achievable with little or no impact on the turn-on threshold, breakdown voltage or other critical electrical parameters. In addition, cell designs for low to medium voltage applications typically employ relatively shallow p-body regions 20 as described. The base region of the parasitic bipolar is relatively narrow as a result, thus reducing any need for a "shorting" p+ profile beneath the source. However, and as will be seen, the present invention is also applicable to and effective in combination with a p+ shorting region beneath the source for use in high voltage applications.

Figure 12:
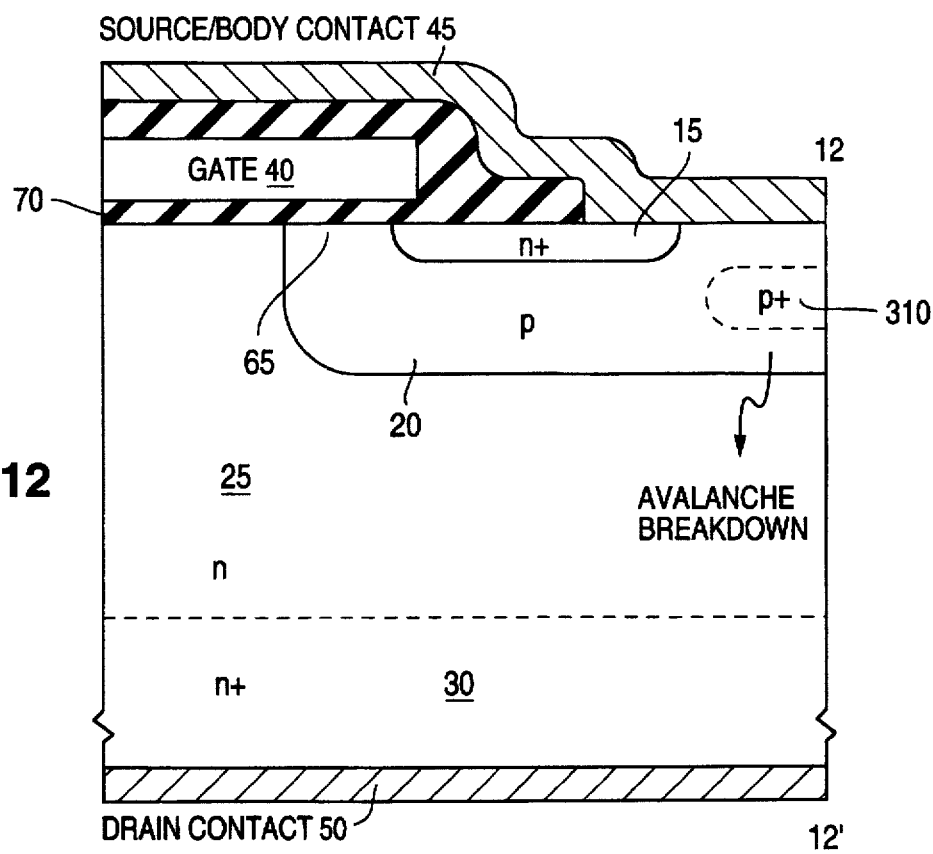
FIG. 12 is a cross sectional view illustrating in part a vertical, planar DMOS FET cell incorporating a second preferred embodiment of the present invention.
Figure 13:
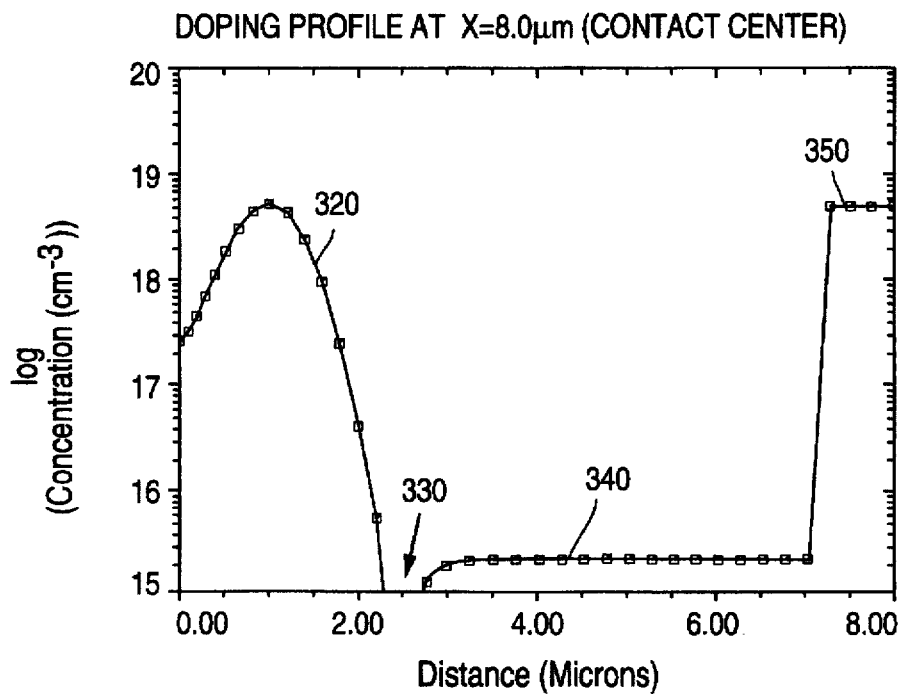
FIG. 13 is a graph illustrating an exemplary profile of doping concentration versus depth taken through the center of the cell of FIG. 12.
Figure 14:
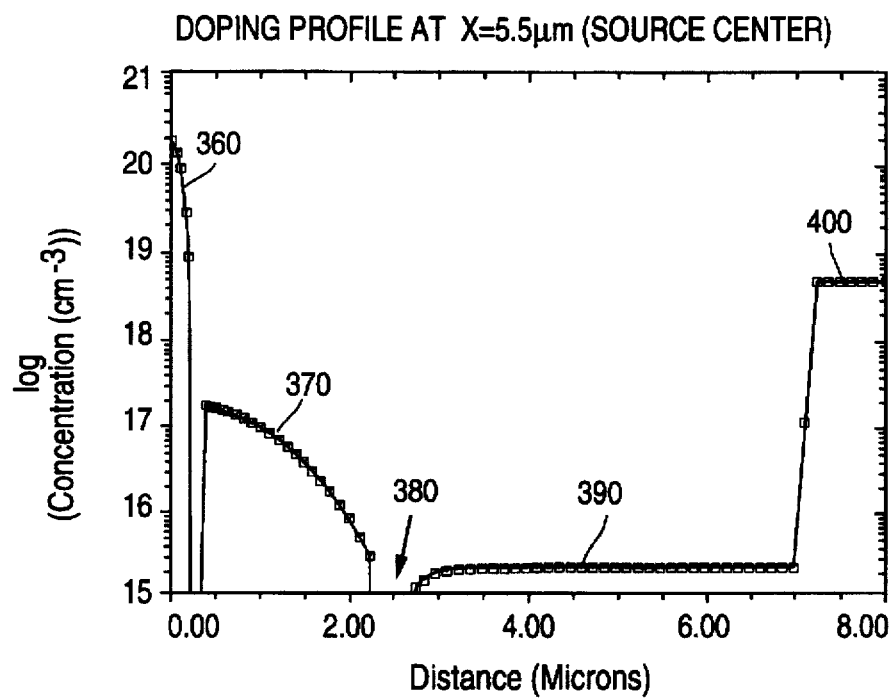
FIG. 14 is a graph illustrating an exemplary profile of doping concentration versus depth taken through the center of the source region of the cell of FIG. 12.

A vertical, planar, n-channel, enhancement mode MOSFET cell incorporating a second preferred embodiment is shown in FIGS. 12–14. The cell of FIG. 12 is substantially identical to the cell of FIG. 7 and therefore corresponding regions are labelled with the same reference numbers. The significant distinction of the cell of FIG. 12 is a highly doped p+ region 310 having a subsurface peaked dopant concentration in the central cell region, substantially along line 12-12'. As with the surface-peaked p+ region 250, the p+ subsurface peaked region 310 is preferably introduced relatively late in the fabrication process in place of the introduction and drive of the shallow p+ region 95 typically used.

The depth (below the upper chip surface) of the peak net dopant concentration into the p+ region 310 normally is 30–60 percent of the depth of the p-body region 20. In particular, the depth of the peak net dopant concentration in the p+ region 310 is 0.6–2.4 microns when the depth of the p-body region 20 is 2–4 microns.

The p+ region 310 (i.e., its lower surface) normally extends to a depth of 75–90 percent of the depth of the p-body region 20. Specifically, the depth of the p region 310 is 1.5–3.5 microns when the depth of the p-body region 20 is 2–4 microns.

In the particular cell of FIGS. 12–14, the peak concentration depth of region 310 is approximately 1μ. However, with a p-body junction depth on the order of 2.5μ, subsurface peak depths between about 0.8 and 1.6μ are suitable. Concentration peaks in that range of depths can be obtained using conventional ion implantation equipment at energies ranging from about 300–800 keV, depending on the depth desired and the particular species being implanted. Boron, for example, is a relatively small atom and can therefore easily be implanted with a peak concentration in the desired range of depths at an energy between about 300–800 kev.

As with the surface peaked p+ region 250 of the cell of FIG. 7, it is preferable to mask the implant of the p+ region 310 so as to not overlap the p-body region 20 beneath the source 15, and so as to avoid any significant incursion into the source region due to subsequent process steps. While it is feasible to extend the subsurface peaked p+ region 310 partially beneath the source 15 and still obtain substantial benefits of the invention, extension of the p+ region 310 too far beneath the source tends to redirect the flow of avalanche breakdown current in the vicinity of the source 15 and channel 65 regions as well as to increase the possibility of additional dopant entering the channel region 65 and altering the threshold characteristic of the device. Thus, it is most preferred to constrain the subsurface p+ region 310 within the central cell region defined by the inner periphery of the source 15.

FIGS. 13 and 14 depict a preferred doping concentration profile for the cell of FIG. 12 taken through the center of the cell and the center of the source 15 respectively. Referring to FIG. 13, line 320 depicts the composite doping concentration profile through the portion of the p-body 20 adjacent to the upper surface of the wafer, the subsurface peaked p+ region 310, and the remaining portion of the p-body 20, taken through the center of the cell. In this cell, the peak surface concentration in the central cell region is substantially due to the p-body 20 doping and is roughly $2.0 \times 10^{17}$ atoms per cubic centimeter. The doping concentration beneath the surface rises to a peak concentration of roughly $5\times10^{18}$ atoms per cubic centimeter at a depth of approximately 1μ, and then falls off to a metallurgical junction, depicted by point 330, between the p-body 20 and n-type drain region 25 at a depth of approximately 2.5μ. The epitaxial drain region having a doping concentration profile depicted by line 340, is uniformly and relatively lightly doped n-type to a concentration of approximately $2\times10^{15}$ atoms per cubic centimeter, and has a thickness of approximately 7.25μ. The doping concentration profile of the n+ substrate 30 is depicted by line 350. The substrate begins at a depth of approximately 7.25μ and continues to the lower surface of the wafer. It is uniformly and heavily doped n+ to a concentration on the order of $5\times10^{18}$ to $1\times10^{20}$ atoms per cubic centimeter.

Referring to FIG. 14, line 360 depicts the doping concentration profile of the n+ source region 15, which has a surface concentration of approximately $2\times10^{20}$ atoms per cubic centimeter, and which falls off to a junction with the p-type body region 20 at a depth of approximately 0.3μ. Any conventional n-type dopant may be used for the source in this embodiment, including phosphorus or arsenic. Arsenic may be preferable for very shallow source-body junctions since it is a relatively slow diffusing species. Line 370 depicts the doping concentration profile corresponding to the p-body region 20 beneath the center of the source 15. This region declines from a peak concentration of approximately $2\times10^{17}$ atoms per cubic centimeter adjacent to the source junction to a metallurgical junction with the n-type epitaxial drain region 25 at a depth of approximately 2.5μ. Point 380 identifies the junction. Line 390 depicts the doping concentration of the uniformly, relatively-lightly doped n-type epitaxial drain region 25. Line 400 depicts the highly doped n+ substrate region 30.

Under drain avalanche conditions, the cell of FIGS. 12–14, like the cell of FIG. 7, effectively concentrates the intensity of the electric field in the central cell region, away from the source 15 and channel 65 regions, and effectively redirects avalanche current flow away from the base of the parasitic bipolar transistor, thereby preventing its activation. The effectiveness of the subsurface peaked p+ region 310 in this regard is graphically illustrated in FIGS. 15–18.

Figure 15:
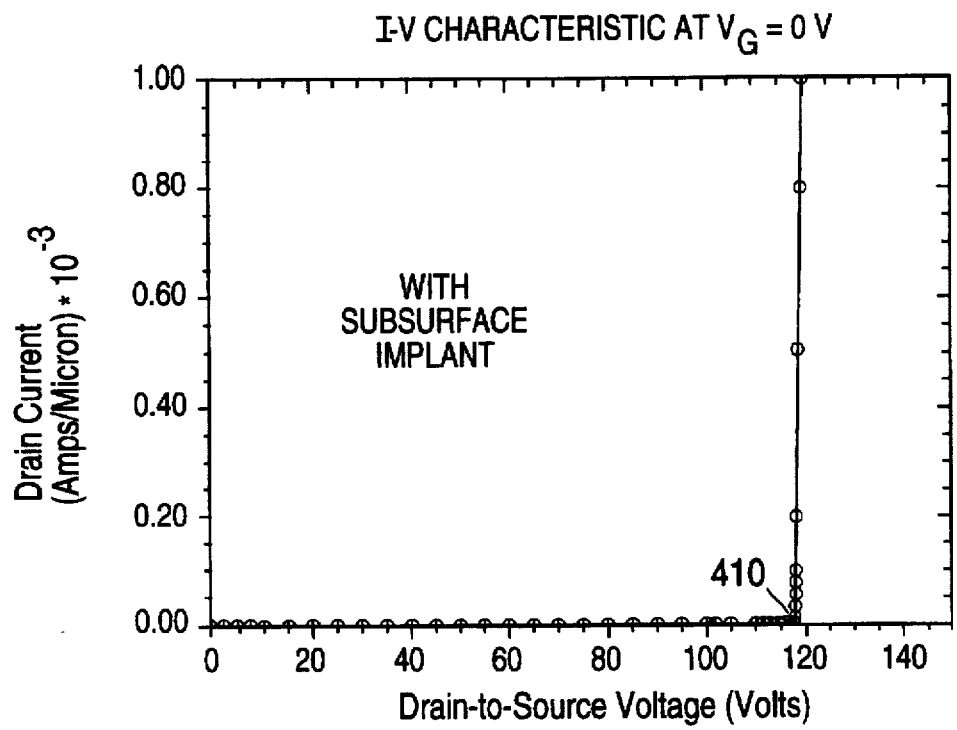
FIG. 15 is a graph illustrating an exemplary drain current versus voltage characteristic in reverse blocking mode for a vertical, planar DMOS FET embodying the cell design of FIG. 12.
Figure 16:
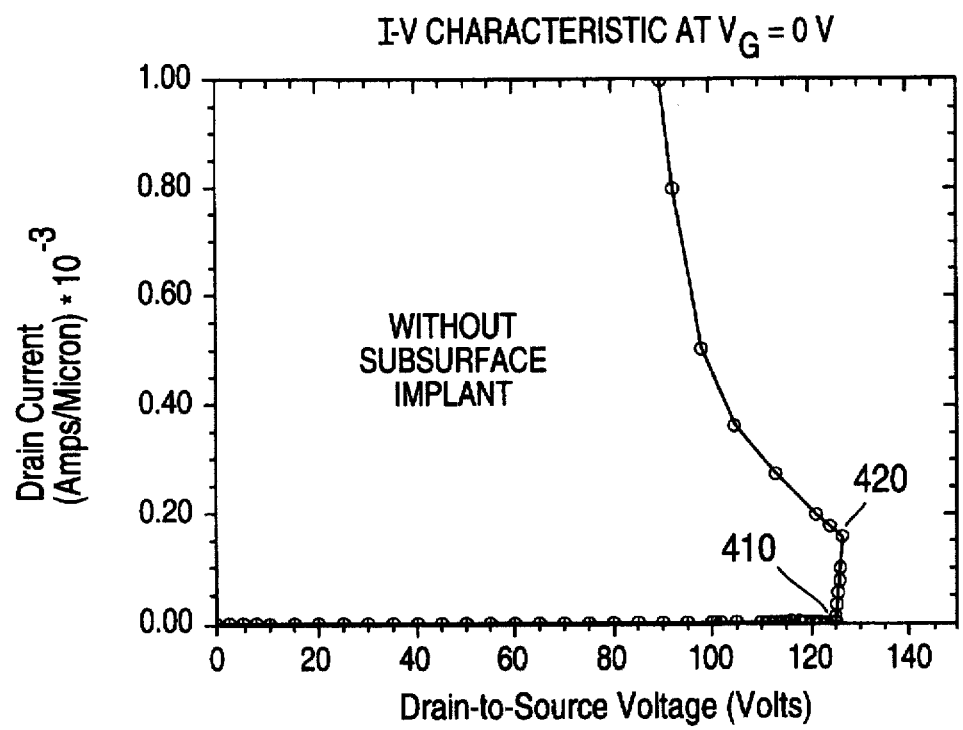
FIG. 16 is a graph illustrating an exemplary drain current versus voltage characteristic in reverse blocking mode for a vertical, planar DMOS FET embodying the cell design of FIG. 12 without p+ region 310.

Referring to FIGS. 15 and 16, with the subsurface peaked p+ region 310 and the n-type epi having doping concentration and thickness as described, an exemplary MOSFET has a breakdown drain voltage of approximately 118 volts, as depicted at point 410 in FIG. 15. Under ensuing drain avalanche conditions, avalanche current flow increases linearly and substantially with little additional application of drain voltage. However, no "snap-back" characteristic is observed.

In contrast, without the highly-doped p+ region 310, the device's drain breakdown voltage, as depicted at point 410 in FIG. 16, is slightly higher at approximately 122 volts. However, under ensuing drain avalanche conditions, as the drain voltage increases slightly, the drain voltage of the device suddenly "snaps back" at point 420. This "snap back" is characteristic of activation of the parasitic bipolar transistor. In the snap-back condition, the avalanche current continues to increase dramatically while the drain voltage drops somewhat, due to the presence of the parallel current flow path into the source region of the MOSFET cell through the parasitic bipolar. Since the snap back condition occurs at a relatively high avalanche current flow of 0.2 mA per micron in this particular embodiment, the device is put at great risk of physical destruction. The addition of dopant into the base of the parasitic bipolar by way of shallow-body 95, for example, results in the snap-back occurring at even higher avalanche currents.

With the addition of the p+ subsurface peaked region 310, the breakdown drain voltage of the device is reduced by approximately 4–5 volts, which is less than 5%, as compared to the embodiment without the subsurface region 310. However, this very slight reduction is a more than acceptable tradeoff for the substantially improved device ruggedness observed.

Figure 17:
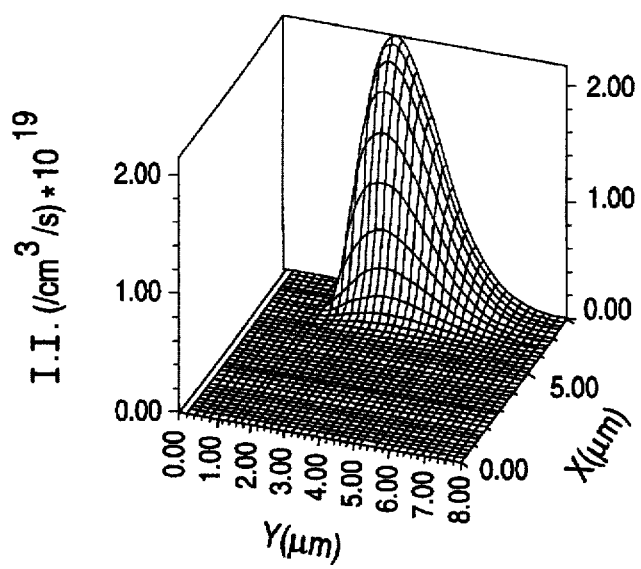
FIG. 17 is a three dimensional graph illustrating an exemplary ionization pattern within the cell of FIG. 12 under a drain avalanche condition.
Figure 18:
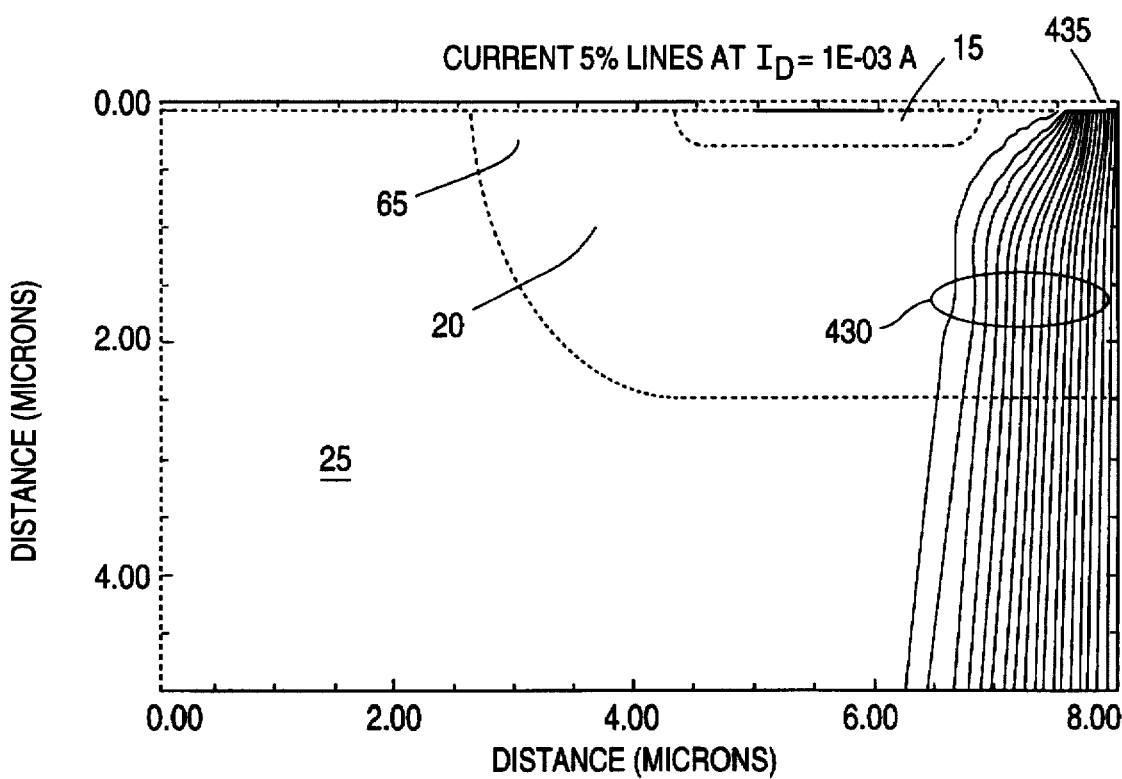
FIG. 18 is a cross sectional view illustrating avalanche current flow in the cell of FIG. 12 under a drain avalanche condition.

Referring to FIGS. 17 and 18, maximum ionization under drain avalanche conditions at a drain voltage of 117.7 volts for the cell of FIGS. 12–14 takes place between about X coordinates 7–8μ and Y coordinates 2.5–4μ. In FIG. 18, the horizontal axis corresponds to the X coordinate axis of FIG. 17 and the vertical axis corresponds to the Y coordinate axis of FIG. 17. FIGS. 17 and 18 demonstrate that the peak ionization is substantially confined to the central cell region and is substantially below the upper surface of the wafer, rather than the region beneath and adjacent to the source 15 and channel 65 regions. As shown in FIG. 18, as a result, the avalanche current flow depicted by current lines 430 is effectively removed from beneath the source 15 region and is concentrated in the central cell region. The crowding of the current lines in the central cell region indicates the electric field intensity is concentrated in the central cell region, and not in the source 15 and channel 65 regions. The convergence and crowding of the current lines at point 435 at the upper surface corresponding to approximately Y coordinate 0 and X coordinate 7.5, further indicates the flow of substantially all avalanche breakdown current is in the central cell region. Thus, the preferred subsurface peaked p+ region 310, like the surface peaked p+ region 250, effectively concentrates the electric field intensity in the central cell region and away from source 15 and channel 65 regions, redirects the avalanche current flow into the central cell region, and redirects the point of avalanche breakdown there. As a result it substantially improves the ruggedness of the device.

Figure 19:
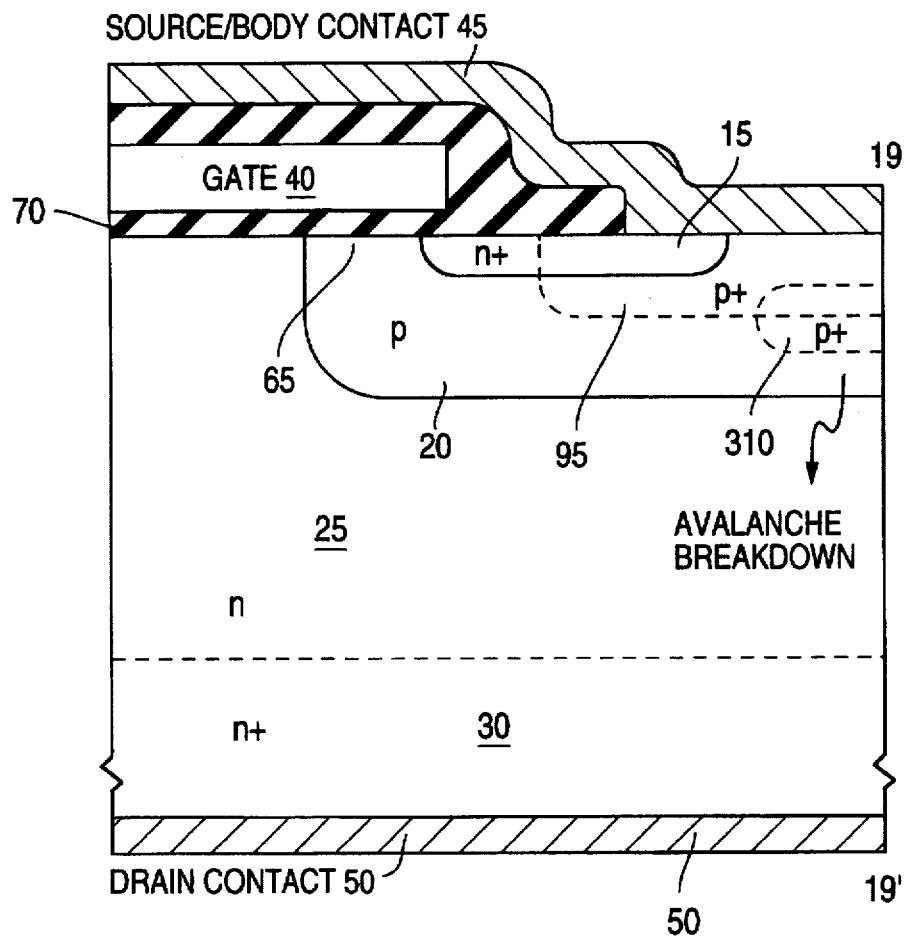
FIG. 19 is a cross sectional view illustrating in part a cell of vertical planar DMOS FET incorporating a third preferred embodiment of the present invention.
Figure 20:
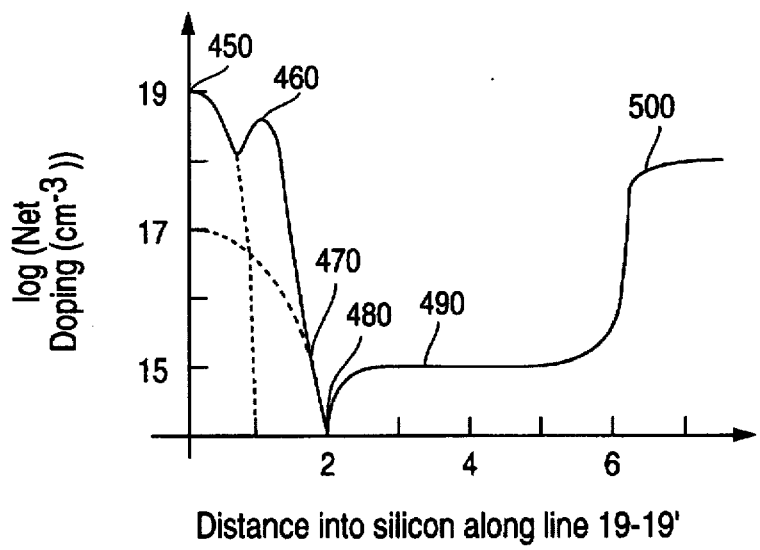
FIG. 20 is a graph illustrating an exemplary profile of doping concentration versus depth taken through the center of the cell of FIG. 19.

The present invention also has application and is effective in combination with the commonly used shallow-body p+ region 95. Referring to FIGS. 19–20, a vertical, planar, n-channel, enhancement mode MOSFET cell incorporating another preferred embodiment of the present invention is illustrated. In the cell of FIG. 19, a subsurface peaked, highly-doped p+ region 310, identical to the same region used in the cell of FIG. 12, is employed in the central cell region in combination with the shallow p+ region 95 commonly used in prior art MOSFET cell designs.

Alternatively, a surface-peaked region such as region 250 of FIG. 7 could be used in place of region 310.

In this alternative, the peak net dopant concentration in the p+ region 250 is two to four times the peak net dopant concentration in the p+ region 95, just as described above in comparing p+ region 250 in the MOSFET cell of FIG. 7 to p+ region 95 in the MOSFET cell of FIG. 4. Similarly, as in the MOSFET cell of FIG. 7, the peak net dopant concentration in the p+ region 250 in the alternative implementation of FIG. 19 is $10^{18}$–$10^{20}$ atoms per cubic centimeter when the peak net dopant concentration in the p-body region 20 is $10^{17}$–$10^{18}$ atoms per cubic centimeter. The depth of the p+ region 250 into the p-body region 20 in this alternative likewise falls into the ranges given above for the MOSFET cell of FIG. 7.

The shallow p+ region 95 is introduced into the p-body 20 in the typical fashion. The subsurface peaked p+ region 310 is preferably introduced in the same manner discussed with reference to the cell of FIG. 12. In this case, the p+ region 310 is preferably introduced late in the fabrication process either just before or just after the shallow p+ region 95. The concentrations and depths of the central p+ region 310 are suitably as discussed with respect to the cell of FIG. 12.

Specifically, the peak net dopant concentration in the p+ region 95 is typically two to four times the peak net dopant concentration in the p+ region 310. Subject to this restriction, the peak net dopant concentration in the p+ region 310 is $5 \times 10^{18} - 5 \times 10^{19}$ atoms per cubic centimeter for the exemplary case in which the peak net dopant concentration in the p+ region 95 is $1 \times 10^{19} - 1 \times 10^{20}$ atoms per cubic centimeter.

The shallow p+ region 95 is preferably doped to a peak surface concentration on the order of approximately $1-2 \times 10^{19}$ atoms per cubic centimeter, which is within a typical range for such regions. The p+ region 95 extends into the p-body region 20 to a depth of approximately 1.2μ in the particular embodiment shown. However, as is known, the shallow p+ region 95 and p-body region 20 may be either shallower or deeper depending upon the desired device characteristics and dimensions. As with the cell of FIG. 12, the central p+ region 310 preferably has a peak doping concentration of approximately $5 \times 10^{18}$ atoms per cubic centimeter at a depth of approximately 1μ below the upper surface of the wafer. However, the peak concentration may be adjusted upwardly or downwardly as necessary to achieve the objectives of the invention, as may the depth of the peak concentration. Generally, a subsurface peak in the range of 0.8–1.4μ is suitable to provide the desired effects when, as here, the p-body 20 junction is on the order of 2.5μ deep. The source 15, epitaxial drain region 25, and n+ substrate 30 are all the same as described with reference to the cell of FIG. 12.

Referring to FIG. 20, the combination of the subsurface peaked p+ region 310 in the central cell region, and the shallow p+ region 95, results in a doping concentration profile having a double peak. A first peak occurs at point 450 at the upper surface of the wafer and is due to the peak surface concentration of the shallow p+ region 95. A second peak occurs at point 460 beneath the upper surface and is due to the additional peak dopant concentration in that region corresponding to the p+ region 310. The concentration in the central cell region then declines and transitions into the p-body 20 at point 470 at a depth of approximately 1.7–1.8μ. The p-body transitions into a metallurgical junction with the n-type epitaxial drain region 25 at point 480 at a depth of approximately 2.5μ. Lines 490 and 500 depict the doping concentration profiles of the n-type epitaxial drain region 25 and the n+ substrate region 30 respectively, which are essentially the same as described with respect to FIGS. 8 and 14.

The cell of FIGS. 19 and 20 is particularly advantageous for use in very high power MOSFETs in which the p-body region 20 beneath the source 15 may be somewhat deeper than in lower power devices. The p-body in that instance may present a laterally wider parasitic bipolar base region which may enhance activation of the parasitic bipolar. In such MOSFET cells, it may be desirable to provide additional doping in the base region of the parasitic bipolar by way of the shallow p+ region 95 in order to assist in inhibiting activation of the parasitic bipolar.

The combination of the subsurface peaked p+ region 310 in the central cell region and the shallow p+ region 95 is effective in substantially preventing avalanche current flow into the base of the parasitic bipolar transistor, in inhibiting activation of the parasitic bipolar by whatever avalanche current may flow in the base, and in substantially concentrating the intensity of the electric field and the avalanche current flow away from the source 15 and channel 65 regions and in the central cell region.

Figure 21:
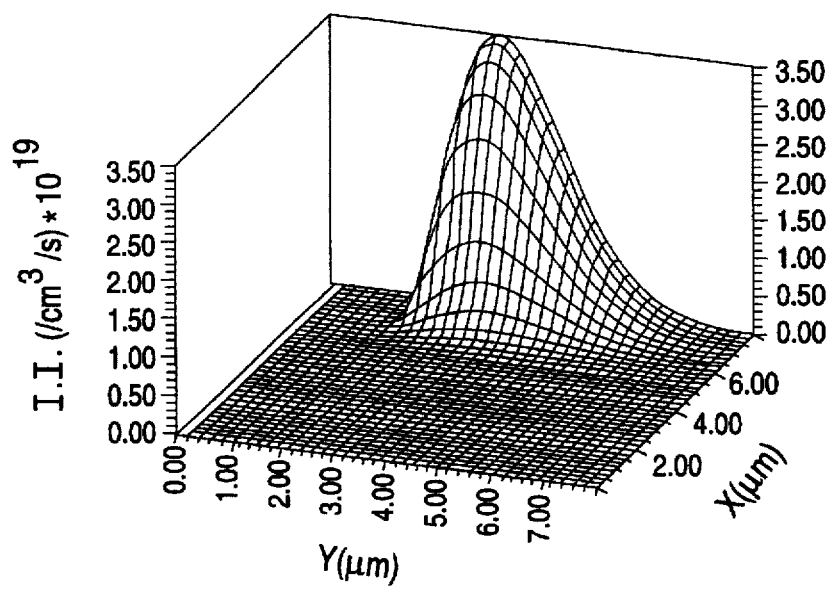
FIG. 21 is a three dimensional graph illustrating an exemplary ionization pattern within the cell of FIG. 19 in a condition of drain avalanche.

Referring to FIG. 21, an exemplary MOSFET with epi thickness and doping concentration as described in connection with the cell of FIG. 19 is in a drain avalanche condition at a drain voltage of approximately 116 volts. Under drain avalanche, peak ionization takes place at about X coordinates 7–8μ (the device center) and Y coordinates 2.5–4μ.

Figure 22:
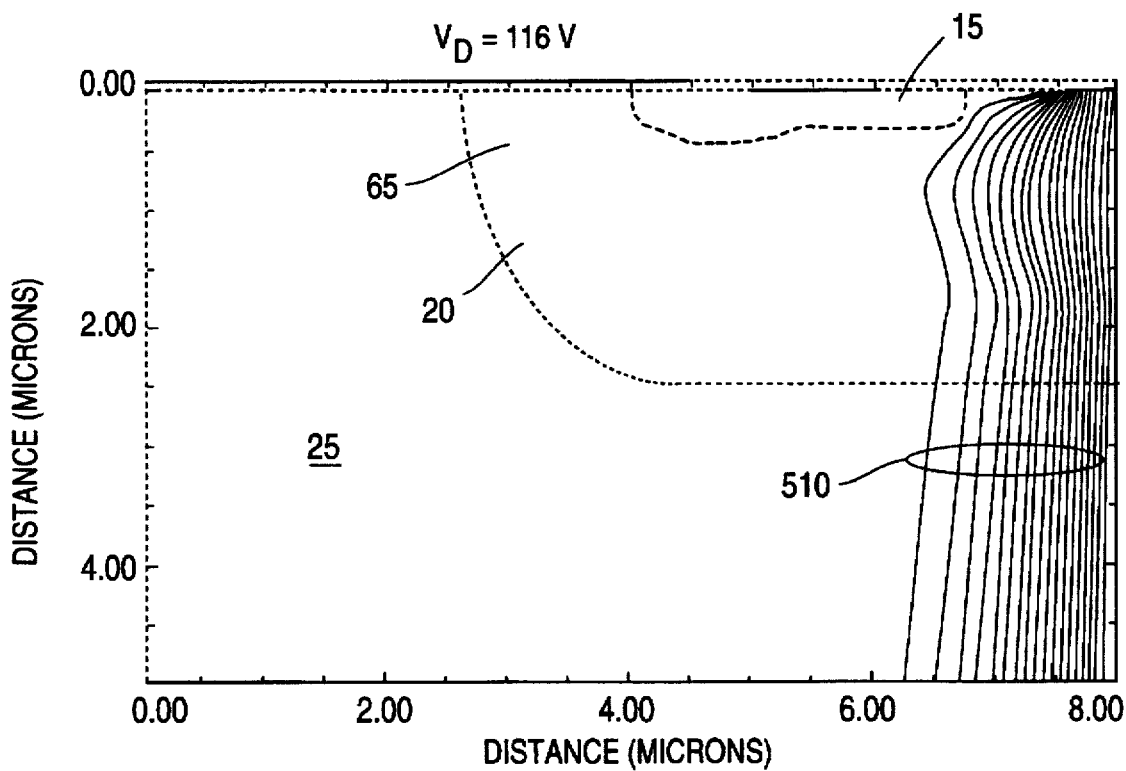
FIG. 22 is a cross sectional view illustrating avalanche current flow in the cell of FIG. 19 under a drain avalanche condition.

Referring to FIG. 22, the horizontal axis corresponds to the X coordinate of FIG. 21 and the vertical axis corresponds to the Y coordinate of FIG. 21. From FIGS. 21 and 22, it is thus seen that peak ionization takes place in the vicinity of the body-drain junction in the central cell region away from the source 15 and channel 65 regions. The convergence and crowding of the current lines in the central cell region indicates the electric field is substantially concentrated in the central cell region and not in the source and channel regions. The path of the current lines 510 demonstrates that substantially all of the avalanche current flow is substantially redirected away from the base of the parasitic bipolar beneath the source 15 and into the central region of the cell.

Figure 23:
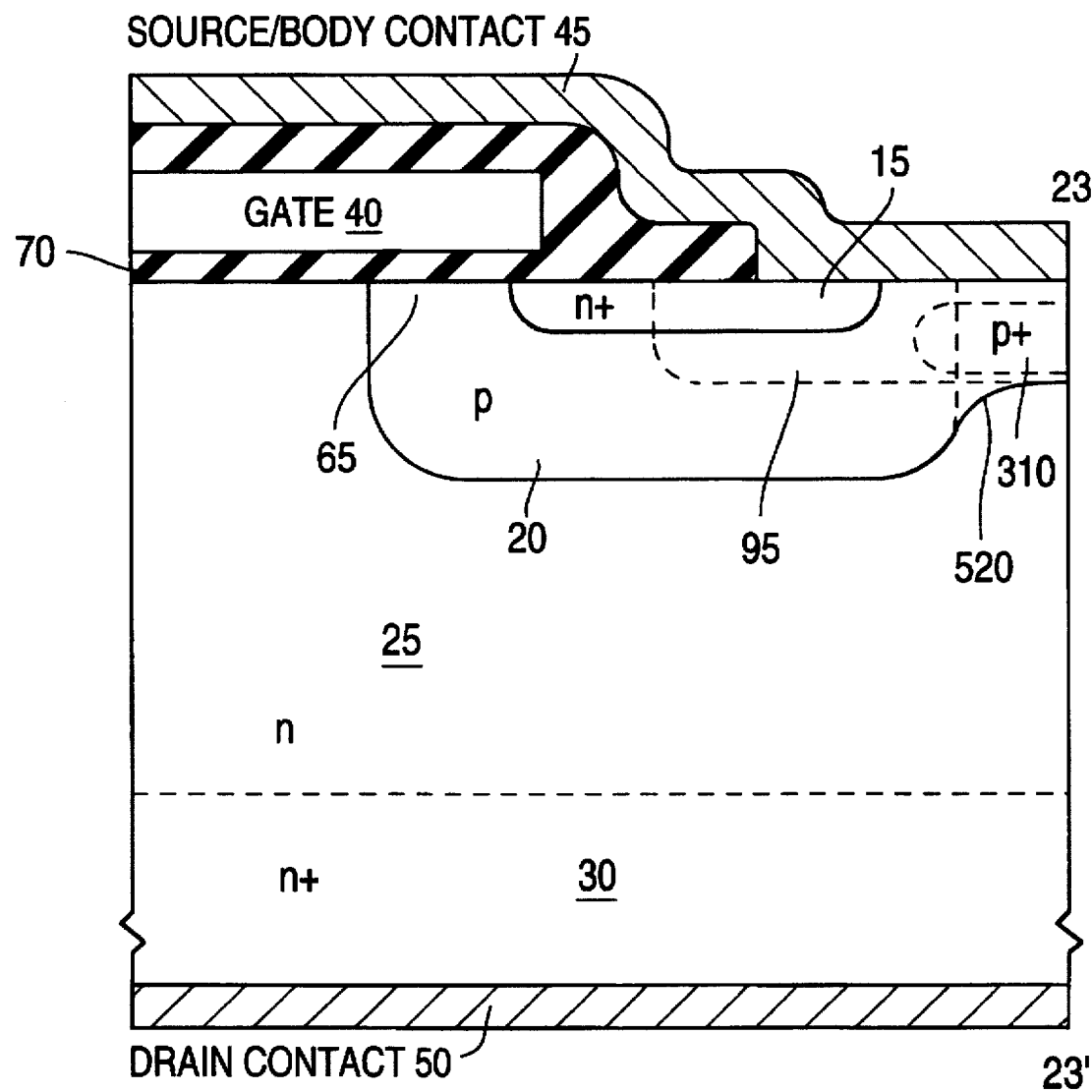
FIG. 23 is a cross sectional view illustrating in part a cell of a vertical planar DMOS FET which is a variation of the cell of FIG. 19.

FIG. 23 illustrates a cell of yet another vertical, planar, n-channel, enhancement mode MOSFET incorporating still another preferred embodiment of the invention. The cell of FIG. 23 is a variation of the cell of FIGS. 19 and 20 and, unless otherwise noted, the description of the cells of FIGS. 19 and 20 applies equally to the cell of FIG. 23. An exemplary doping concentration profile corresponding to the cell of FIG. 23 is not illustrated. However, the profile will be substantially similar to that shown in FIG. 20 except that the vertical distance between the p+ subsurface peaked region 310 and the metallurgical body-drain junction in the central cell region around the line 23-23' will generally be slightly less than in the cells of FIGS. 19–20.

In the cell of FIG. 23, the portion of the p-body 20 in the central region of the cell is made shallower than the portion underlying the source and channel regions. As a result, the metallurgical junction between the p-body 20 and the n-type epitaxial drain region 25 is shallower in the central cell region than in the region beneath the source 15 and channel 65. This produces an additional curved region 520 in the junction between the p-body 20 and the drain region 25 in the central region of the cell. This curvature of the body-drain junction tends to further assist in concentrating the electric field intensity in the central region of the cell and away from the source 15 and drain 65 regions. Thus, in combination with the surface-peaked region 250, or the subsurface peaked p+ region 310, with or without the shallow p+ region 95, it is effective in preventing activation of the parasitic bipolar and in redirecting avalanche current flow into the central cell region.

The variation of FIG. 23 does add additional complexity to the fabrication process which the preferred embodiments of FIGS. 12 and 19 do not. First, the typical p-body 20 mask must be altered to mask the central cell region when the p-body 20 dopant is first introduced and driven. An additional masking, implant, and drive operation is then required to produce the shallow portion of the p-body 20. This additional operation masks all but the central region of the cell for a relatively low energy implant of p-type dopant. For example, an implant energy less than 100 KeV, typically 60–80 keV, could be used to implant boron to a surface concentration of approximately 2.5×10$^{17}$ atoms per cubic centimeter. A standard drive temperature and time would then be used to drive the shallow p-body junction to a nearly final depth of approximately 1.5μ. Additional processing associated with the subsurface peaked p+ region 310 and shallow p+ region 95 will also affect the final junction depth slightly. Moreover, this junction depth may be adjusted relative to the depths of the p+ region 310, shallow p+ region 95 and p-body region 20 in order to optimize the desired effect.

Figure 24:
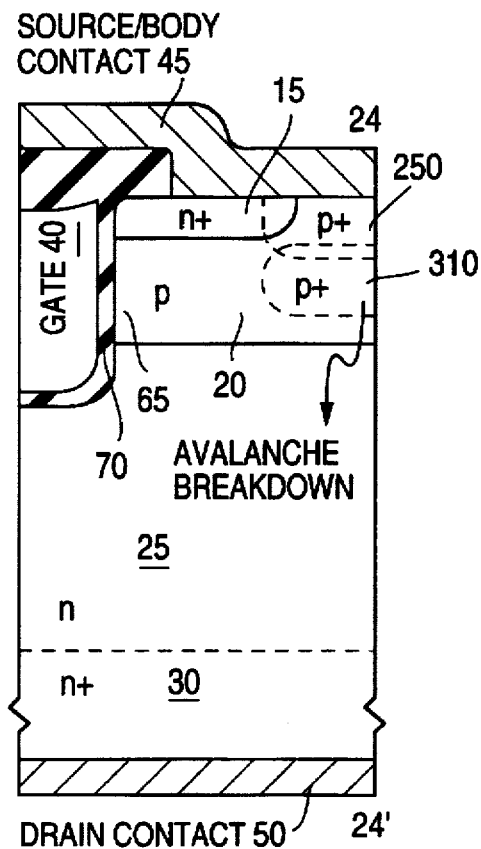
FIG. 24 is a cross sectional view illustrating in part a cell of a vertical non-planar DMOS FET having a trench-type insulated gate and incorporating a fourth preferred embodiment of the present invention.
Figure 25:
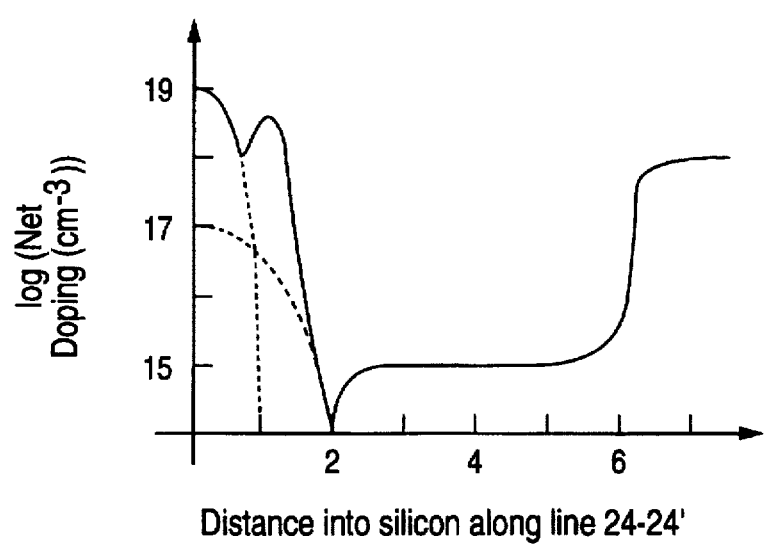
FIG. 25 is a graph illustrating an exemplary profile of doping concentration versus depth taken through the center of the cell of FIG. 24.

FIGS. 24 and 25 illustrate yet another cell of a vertical, enhancement mode, n-channel MOSFET which incorporates another preferred embodiment of the present invention. In contrast to the previous embodiments, however, this cell is non-planar and employs a trench-type insulated gate structure. The fabrication of MOSFETs and other semiconductor devices having trench-type insulated gates is well known to those skilled in the art and the details need not be set forth herein. For purposes of the present invention, essentially the only difference between a cell design having a planar top surface insulated gate configuration and one having a trench-type insulated gate configuration is that the channel region 65 is moved from the upper surface of the wafer to a region beneath the surface of the wafer. In both cases the channel region 65 is still defined by the area adjacent the gate structure and between the source 15 region and the outer periphery of the p-body 20 region where it reaches a junction with the n-type epitaxial drain region 25.

As in the planar embodiments, additional p+ dopant is introduced into the central cell region in order to concentrate the electric field intensity and avalanche current flow in that region and away from the source 15 and channel 65 regions. As shown in FIG. 24, a combination of a surface-peaked p+ region 250, as in the cell of FIG. 7 and a subsurface peaked p+ region 310, as in the cell of FIG. 12, can be used. Alternatively, either can be used alone, with concentrations and depths selected to produce the desired effects. Although the surface-peaked p+ region 250 may be extended laterally similarly to the commonly used shallow p+ region 95 shown in the preferred embodiment of FIG. 19, extra care must be taken to prevent the shallow p+ region 95 from extending into the gate region 65, which will adversely affect the turn-on or threshold characteristic of the device.

FIG. 25 shows an exemplary doping profile taken through the center of the cell of FIG. 24, substantially along line 24-24'. As is apparent, the exemplary doping profile of FIG. 25 is essentially identical to that shown in FIG. 20 and the description corresponding to FIG. 20 is equally applicable with respect to FIG. 25.

The features characterizing the present invention have been described in detail in connection with a number of alternative preferred embodiments. The descriptions of the preferred embodiments are intended to be exemplary in nature rather than restrictive. Numerous alterations and variations will be apparent to persons skilled in the art. Among these are choices of dopant species and concentrations; variations in junction and peak concentration depths; alternative configurations of devices as n-channel or p-channel devices; alternative configurations of devices as enhancement or depletion mode devices; substitutions of planar and trench-type insulated gates; alternative configurations of devices as 3 or 4 layer semiconductor devices; and alternative configuration of devices as DMOS or conventional MOS structures. All of these, as well as other changes and variations which embody the features, characteristics, and objectives of the present invention are intended to be within the spirit and scope of the invention as defined in the appended claims.

What is claimed is:

1. An insulated gate field effect semiconductor device comprising:
   a semiconductor chip having an upper surface;
   a drain region of a first conductivity type situated in the chip and extending to its upper surface;
   a plurality of cells, each comprising:
      a body region of a second conductivity type opposite to the first conductivity type situated in the drain region and extending to the upper surface of the chip; and
      a source region of the first conductivity type situated in the body region, spaced apart from the drain region, and extending to the upper surface of the chip, a channel region of the body region extending between the source and drain regions, a subsurface-peaked portion of the body region (a) being spaced apart from the channel region, (b) reaching a peak net dopant concentration below the upper surface of the chip at a peak net dopant concentration value greater than that of material of the body region forming and underlying the channel region, (c) extending no more than an electrically insignificant amount below the source region, and (d) not extending significantly deeper below the upper surface of the chip than material of the body region underlying the source region; and
   an insulated gate structure situated along the channel regions outside the chip.

2. A device as in claim 1 wherein electric field intensity and avalanche current flow that arise when the device is operated in blocking mode under a drain avalanche condition are, in each cell, substantially concentrated in the subsurface-peaked portion such that activation of a bipolar transistor comprising adjacent portions of the source, body, and drain regions is substantially inhibited.

3. A device as in claim 1 where, in at least one of the cells as viewed in a direction perpendicular to the upper surface of the chip, the source region is shaped like an annulus and laterally surrounds the subsurface-peaked portion.

4. A device as in claim 1 where, in at least one of the cells, the peak net dopant concentration of the subsurface-peaked portion is greater than that of at least part of the material of the body region underlying the source region.

5. A device as in claim 1 where, in at least one of the cells, the peak net dopant concentration of the subsurface-peaked portion is greater than that of substantially all the material of the body region underlying the source region.

6. A device as in claim 1 where, in at least one of the cells, the subsurface-peaked portion extends deeper below the upper surface of the chip than the source region.

7. A device as in claim 1 where, in at least one of the cells, material of the body region outside the subsurface-peaked portion extends deeper below the upper surface of the chip than the subsurface-peaked portion.

8. A device as in claim 1 wherein the insulated gate structure comprises:
   an electrically insulating layer situated over the chip along its upper surface; and
   a patterned gate electrode situated over the insulating layer and extending over the channel regions, where each channel region extends along the upper surface of the chip.

9. An insulated gate field effect semiconductor device comprising:
   a semiconductor chip having an upper surface;
   a drain region of a first conductivity type situated in the chip and extending to its upper surface;

a plurality of cells, each comprising:
- a body region of a second conductivity type opposite to the first conductivity type situated in the drain region and extending to the upper surface of the chip; and
- a source region of the first conductivity type situated in the body region, spaced apart from the drain region, and extending to the upper surface of the chip, a channel region of the body region extending between the source and drain regions, a subsurface-peaked portion of the body region (a) being spaced apart from the channel region, (b) reaching a peak net dopant concentration below the upper surface of the chip at a peak net dopant concentration value greater than that of material of the body region forming and underlying the channel region, and (c) extending no more than an electrically insignificant amount below the source region, a further portion of the body region (a) being spaced apart from the channel region, (b) extending to the upper surface of the chip and at least partly below the source region, and (c) reaching a peak net dopant concentration greater than that of material of the body region forming and underlying the channel region, the peak net dopant concentration of the further portion being different from the peak net dopant concentration of the subsurface-peaked portion, the subsurface-peaked portion not extending significantly deeper below the upper surface of the chip than material of the body region underlying the source region outside the further portion; and
- an insulated gate structure situated along the channel regions outside the chip.

10. A device as in claim 9 wherein electric field intensity and avalanche current flow that arise when the device is operated in blocking mode under a drain avalanche condition are, in each cell, substantially concentrated in the subsurface-peaked portion such that activation of a bipolar transistor comprising adjacent portions of the source, body, and drain regions is substantially inhibited.

11. A device as in claim 9 wherein the subsurface-peaked portion partially overlaps the further portion.

12. A device as in claim 9 where, in at least one of the cells as viewed in a direction perpendicular to the upper surface of the chip, the source region is shaped like an annulus and laterally surrounds the subsurface-peaked portion.

13. A device as in claim 9 where, in at least one of the cells containing the further portion, the further portion does not extend significantly deeper below the upper surface of the chip than the subsurface-peaked portion.

14. A device as in claim 13 where, in at least one of the cells containing the further portion, the peak net dopant concentration of the subsurface-peaked portion is greater than that of material of the body region underlying the source region outside the further portion.

15. A device as in claim 9 where, in at least one of the cells, the subsurface-peaked portion extends deeper below the upper surface of the chip than the source region.

16. A device as in claim 9 where, in at least one of the cells containing the further portion, material of the body region outside the subsurface-peaked and further portions extends deeper below the upper surface of the chip than the subsurface-peaked and further portions.

17. A device as in claim 9 where, in at least one of the cells containing the further portion, the subsurface-peaked portion extends deeper below the upper surface of the chip than the further portion.

18. A device as in claim 9 where, in at least one of the cells containing the further portion, the peak net dopant concentration of the further portion is greater than the peak net dopant concentration of the subsurface-peaked portion.

19. An insulated gate field effect semiconductor device comprising:
- a semiconductor chip having an upper surface;
- a drain region of a first conductivity type situated in the chip and extending to its upper surface;
- a plurality of cells, each comprising:
  - a body region of a second conductivity type opposite to the first conductivity type situated in the drain region and extending to the upper surface of the chip; and
  - an annular source region of the first conductivity type situated in the body region, spaced apart from the drain region, and extending to the upper surface of the chip, a channel region of the body region extending between the source and drain regions, a subsurface-peaked portion of the body region (a) being spaced laterally apart from the channel region, (b) reaching a peak net dopant concentration below the upper surface of the chip at a peak net dopant concentration value greater than that of material of the body region forming and underlying the channel region, (c) extending no more than an electrically insignificant amount below the source region, (d) being surrounded by the source region as viewed in a direction generally perpendicular to the upper surface of the chip, and (e) not extending significantly deeper below the upper surface of the chip than material of the body region underlying the source region, electric field intensity and avalanche current flow that arise when the device is operated in blocking mode under a drain avalanche condition being substantially concentrated in the subsurface-peaked portion such that activation of a parasitic bipolar transistor comprising adjacent portions of the source, body, and drain regions is substantially inhibited; and
- an insulated gate structure situated along the channel regions outside the chip.

20. A device as in claim 19 where, in at least one of the cells, the peak net dopant concentration of the subsurface-peaked portion is greater than that of at least part of the material of the body region underlying the source region.

21. A device as in claim 19 where, in at least one of the cells, the peak net dopant concentration of the subsurface-peaked portion is greater than that of substantially all the material of the body region underlying the source region.

22. A device as in claim 19 where, in at least one of the cells, the subsurface-peaked portion extends deeper below the upper surface of the chip than the source region.

23. A device as in claim 19 where, in at least one of the cells, material of the body region outside the subsurface-peaked portion extends deeper below the upper surface of the chip than the subsurface-peaked portion.

24. A device as in claim 23 where, in at least one of the cells, the depth to which the subsurface-peaked portion extends below the upper surface of the chip is 75–90 percent of the depth to which the body region extends below the upper surface of the chip.

25. A device as in claim 23 where, in at least one of the cells, the depth to which the subsurface-peaked portion extends below the upper surface of the chip is 1.5–3.5 microns, and the depth to which the body region extends below the upper surface of the chip is 2–4 microns.

26. A device as in claim 19 where, in at least one of the cells, the depth at which the peak net dopant concentration of the subsurface-peaked portion occurs below the upper surface of the chip is 30–60 percent of the depth to which the body region extends below the upper surface of the chip.

27. A device as in claim 19 where, in at least one of the cells, the depth at which the peak net dopant concentration of the subsurface-peaked portion occurs below the upper surface of the chip is approximately 0.6–2.4 microns, and the depth to which the body region extends below the upper surface of the chip is 2–4 microns.

28. A device as in claim 19 where, in at least one of the cells, the peak net dopant concentration of the subsurface-peaked portion is at least twice the peak net dopant concentration of material of the body region outside the subsurface-peaked portion.

29. A device as in claim 28 where, in at least one of the cells, the peak net dopant concentration of the subsurface-peaked portion is $10^{18}$–$10^{20}$ atoms/cm$^3$, and the peak net dopant concentration of material of the body region outside the subsurface-peaked portion is $10^{17}$–$10^{18}$ atoms/cm$^3$.

30. A device as in claim 19 where, in at least one of the cells, material of the body region underlying the source region extends deeper below the upper surface of the chip than material of the body region underlying the subsurface-peaked portion.

31. An insulated gate field effect semiconductor device comprising:
    a semiconductor chip having an upper surface;
    a drain region of a first conductivity type situated in the chip and extending to its upper surface;
    a plurality of cells, each comprising:
        a body region of a second conductivity type opposite to the first conductivity type situated in the drain region and extending to the upper surface of the chip; and
        an annular source region of the first conductivity type situated in the body region, spaced apart from the drain region, and extending to the upper surface of the chip, a channel region of the body region extending between the source and drain regions, a subsurface-peaked portion of the body region (a) being spaced laterally apart from the channel region, (b) reaching a peak net dopant concentration below the upper surface of the chip at a peak net dopant concentration value greater than that of material of the body region forming and underlying the channel region, (c) extending no more than an electrically insignificant amount below the source region, and (d) being surrounded by the source region as viewed in a direction generally perpendicular to the upper surface of the chip, a further portion of the body region (a) being spaced apart from the channel region, (b) extending to the upper surface of the chip and at least partly below the source region, and (c) reaching a peak net dopant concentration greater than that of material of the body region forming and underlying the channel region, the peak net dopant concentration of the further portion being different from the peak net dopant concentration of the subsurface-peaked portion, the subsurface-peaked portion not extending significantly deeper below the upper surface of the chip than material of the body region underlying the source region outside the further portion.

32. A device as in claim 31 wherein the subsurface-peaked portion partially overlaps the further portion.

33. A device as in claim 31 where, in at least one of the cells containing the further portion, the further portion does not extend significantly deeper below the upper surface of the chip than the subsurface-peaked portion.

34. A device as in claim 33 where, in at least one of the cells containing the further portion, the peak net dopant concentration of the subsurface-peaked portion is greater than that of material of the body underlying the source region outside the further portion.

35. A device as in claim 31 wherein, in at least one of the cells, the subsurface-peaked portion extends deeper below the upper surface of the chip than the source region.

36. A device as in claim 31 where, in at least one of the cells containing the further portion, material of the body region outside the subsurface-peaked and further portions extends deeper below the upper surface of the chip than the subsurface-peaked and further portions.

37. A device as in claim 36 where, in at least one of the cells, the depth to which the subsurface-peaked portion extends below the upper surface of the chip is 75–90 percent of the depth to which the body region extends below the upper surface of the chip.

38. A device as in claim 36 where, in at least one of the cells, the depth to which the subsurface-peaked portion extends below the upper surface of the chip is 1.5–3.5 microns, and the depth to which the body region extends below the upper surface of the chip is 2–4 microns.

39. A device as in claim 31 where, in at least one of the cells, the depth at which the peak net dopant concentration of the subsurface-peaked portion occurs below the upper surface of the chip is 30–60 percent of the depth to which the body region extends below the upper surface of the chip.

40. A device as in claim 31 where, in at least one of the cells, the depth at which the peak net dopant concentration of the subsurface-peaked portion occurs below the upper surface of the chip is approximately 0.6–2.4 microns, and the depth to which the body region extends below the upper surface of the chip is 2–4 microns.

41. A device as in claim 31 where, in at least one of the cells, the peak net dopant concentration of the subsurface-peaked portion is at least twice the peak net dopant concentration of material of the body region outside the subsurface-peaked portion.

42. A device as in claim 41 where, in at least one of the cells containing the further portion, the peak net dopant concentration of the subsurface-peaked portion is $10^{18}$–$10^{20}$ atoms/cm$^3$, and the peak net dopant concentration of material of the body region outside the subsurface-peaked and further portions is $10^{17}$–$10^{18}$ atoms/cm$^3$.

43. A device as in claim 31 where, in at least one of the cells containing the further portion, the subsurface-peaked portion extends deeper below the upper surface of the chip than the further portion.

44. A device as in claim 31 where, in at least one of the cells containing the further portion, the peak net dopant concentration of the further portion is greater than the peak net dopant concentration of the subsurface-peaked portion.

45. A device as in claim 44 where, in at least one of the cells containing the further portion, the peak net dopant concentration of the further portion is 2–4 times the peak net dopant concentration of the subsurface-peaked portion.

46. A device as in claim 45 where, in at least one of the cells containing the further portion, the peak net dopant concentration of the subsurface-peaked portion is $5 \times 10^{18}$–$5 \times 10^{19}$ atoms/cm$^3$, and the peak net dopant concentration of material of the body region outside the subsurface-peaked and further portions is $10^{17}$–$10^{18}$ atoms/cm$^3$.

47. An insulated gate field effect semiconductor device comprising:
    a semiconductor chip having an upper surface;
    a drain region of a first conductivity type situated in the chip and extending to its upper surface;

a plurality of cells, each comprising:
  a body region of a second conductivity type opposite to the first conductivity type situated in the drain region and extending to the upper surface of the chip; and
  a source region of the first conductivity type situated in the body region, spaced apart from the drain region, and extending to the upper surface of the chip, a channel region of the body region extending between the source and drain regions, a special portion of the body region (a) being spaced apart from the channel region, (b) reaching a peak net dopant concentration greater than that of material of the body region forming and underlying the channel region, and (c) extending no more than an electrically insignificant amount below the source region, material of the body region underlying the source region extending deeper below the upper surface of the chip than material of the body region underlying the special portion; and
  an insulated gate structure situated along the channel regions outside the chip.

48. A device as in claim 47 wherein electric field intensity and avalanche current flow that arise when the device is operated in blocking mode under a drain avalanche condition are, in each cell, substantially concentrated in the special portion such that activation of a bipolar transistor comprising adjacent portions of the source, body, and drain regions is substantially inhibited.

49. A device as in claim 47 where, in at least one of the cells as viewed in a direction perpendicular to the upper face of the chip, the source region is shaped like an annulus and laterally surrounds the special portion.

50. A device as in claim 47 where, in at least one of the cells, a further portion of the body region (a) is spaced apart from the channel region, (b) extends to the upper surface of the chip and at least partly below the source region, and (c) reaches a peak net dopant concentration greater than that of material of the body region forming and underlying the channel region, the peak net dopant concentration of the further portion being different from the peak net dopant concentration of the special portion.

51. An insulated gate field effect semiconductor device comprising:
  a semiconductor chip having an upper surface;
  a drain region of a first conductivity type situated in the chip and extending to its upper surface;
  a plurality of cells, each comprising:
    a body region of a second conductivity type opposite to the first conductivity type situated in the drain region and extending to the upper surface of the chip; and
    an annular source region of the first conductivity type situated in the body region, spaced apart from the drain region, and extending to the upper surface of the chip, a channel region of the body region extending between the source and drain regions, a special portion of the body region (a) being spaced laterally apart from the channel region, (b) reaching a peak net dopant concentration greater than that of material of the body region forming and underlying the channel region, (c) extending no more than an electrically insignificant amount below the source region, and (d) being surrounded by the source region as viewed in a direction generally perpendicular to the upper surface of the chip, electric field intensity and avalanche current flow that arise when the device is operated in blocking mode under a drain avalanche condition being substantially concentrated in the special portion such that activation of a parasitic bipolar transistor comprising adjacent portions of the source, body, and drain regions is substantially inhibited, material of the body region underlying the source region extending deeper below the upper surface of the chip than material of the body region underlying the special portion; and
    an insulated gate structure situated along the channel regions outside the chip.

52. A device as in claim 51 where, in at least one of the cells, a further portion of the body region (a) is spaced apart from the channel region, (b) extends to the upper surface of the chip and at least partly below the source region, and (c) reaches a peak net dopant concentration greater than that of material of the body region forming and underlying the channel region, the peak net dopant concentration of the further portion being different from the peak net dopant concentration of the special portion.

* * * * *